(12) United States Patent
Izumida et al.

(10) Patent No.: US 7,662,679 B2
(45) Date of Patent: Feb. 16, 2010

(54) SEMICONDUCTOR MANUFACTURING METHOD AND SEMICONDUCTOR DEVICE

(75) Inventors: Takashi Izumida, Yokohama (JP); Sanae Ito, Yokohama (JP); Takahisa Kanemura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 11/203,425

(22) Filed: Aug. 15, 2005

(65) Prior Publication Data
US 2006/0244051 A1 Nov. 2, 2006

(30) Foreign Application Priority Data
Apr. 27, 2005 (JP) ............................. 2005-129608

(51) Int. Cl.
H01L 21/00 (2006.01)
H01L 21/84 (2006.01)
H01L 21/336 (2006.01)

(52) U.S. Cl. ................ 438/157; 438/300; 257/E21.394; 257/E21.615; 257/E21.458; 257/E29.049; 257/E29.067; 257/E29.299; 257/E29.256

(58) Field of Classification Search ................ 438/300, 438/157; 257/E29.049, E29.067, E29.299, 257/E29.256, E21.394, E21.615, E21.458
See application file for complete search history.

(56) References Cited

U.S. PATENT DOCUMENTS 5,315,143 A 5/1994 Tsuji 5,844,278 A 12/1998 Mizuno et al.
6,121,075 A * 9/2000 Yamashita ................... 438/149
7,122,871 B2 * 10/2006 Lee et al. ..................... 257/412

FOREIGN PATENT DOCUMENTS

JP 10-93093 (A) 4/1998

OTHER PUBLICATIONS

Taurus Process & Design; Multi-dimensional Process and Device Modeling Program; Version 2001.4 User's Manual; Avant Corporation; TCAD Business Unit.
Masaki Kondo et al., "A FinFET Design Based on Three-Dimensional Process and Device Simulations", SISPAD, IEEE 2003, pp. 179-182.

* cited by examiner

Primary Examiner—Samuel A Gebremariam
(74) Attorney, Agent, or Firm—Foley & Lardner LLP

(57) ABSTRACT

A method of manufacturing a semiconductor device includes forming a mask layer on a first-conductivity-type semiconductor substrate, etching the semiconductor substrate using the mask layer as a mask, thereby forming a projecting semiconductor layer, forming a first insulating layer on the semiconductor substrate to cover a lower portion of the projecting semiconductor layer, doping a first-conductivity-type impurity into the first insulating layer, thereby forming a high-impurity-concentration layer in the lower portion of the projecting semiconductor layer, forming gate insulating films on side surfaces of the projecting semiconductor layer which upwardly extend from an upper surface of the first insulating layer, and forming a gate electrode on the gate insulating films and on the first insulating film.

22 Claims, 14 Drawing Sheets

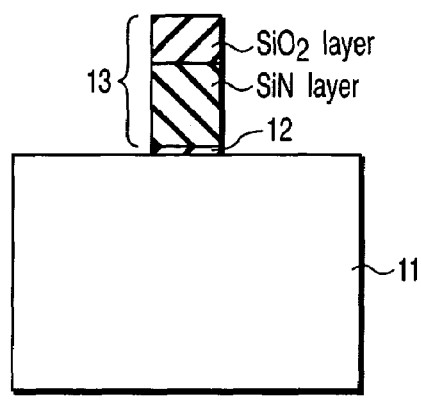
F I G. 6
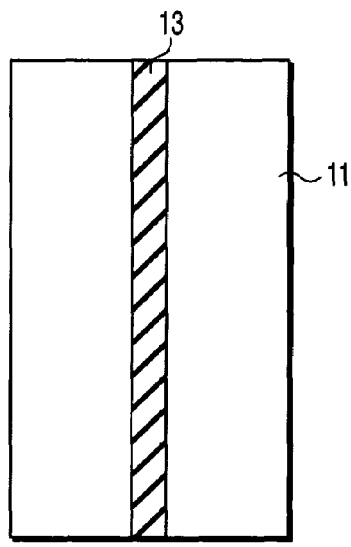
F I G. 7
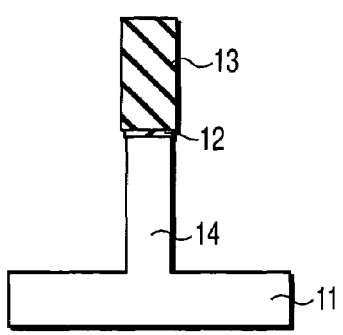
F I G. 8
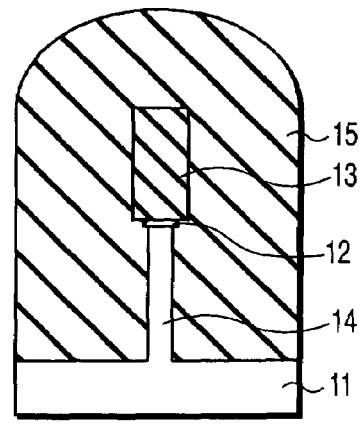
F I G. 9
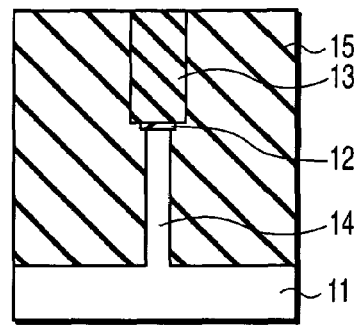
F I G. 10
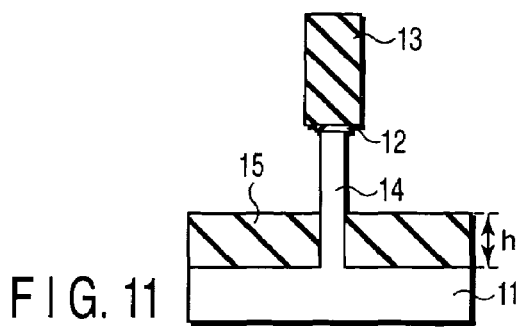
F I G. 11
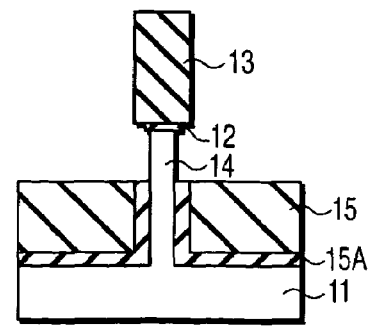
F I G. 12

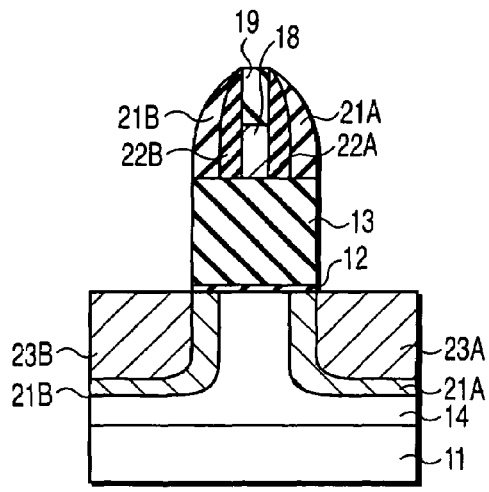
F I G. 30
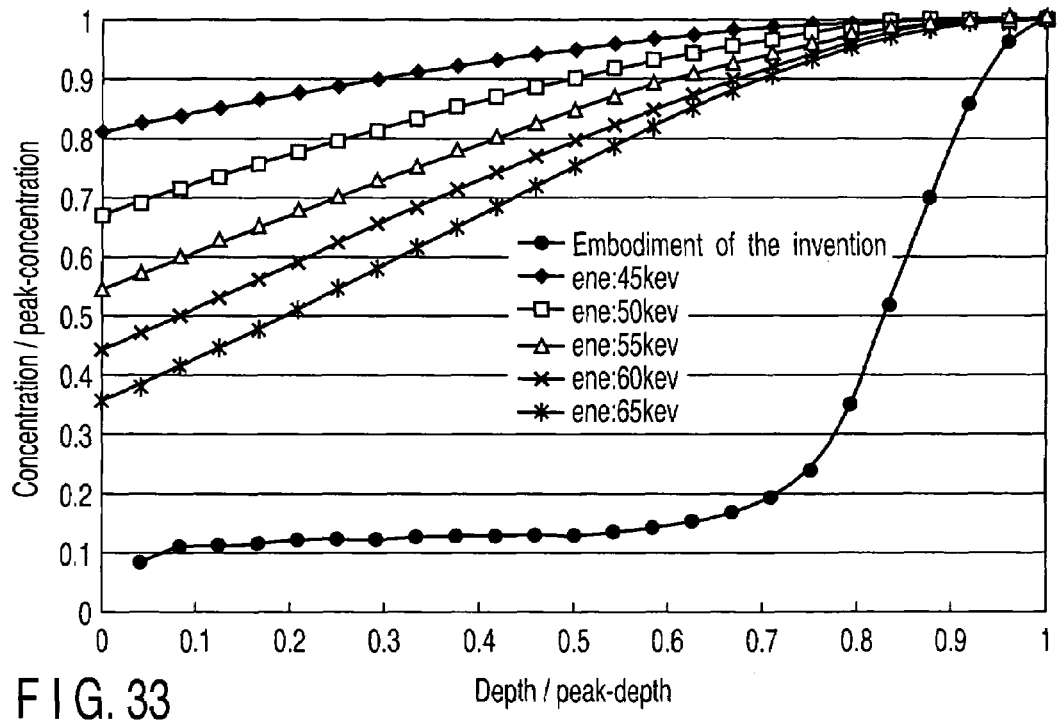
F I G. 33
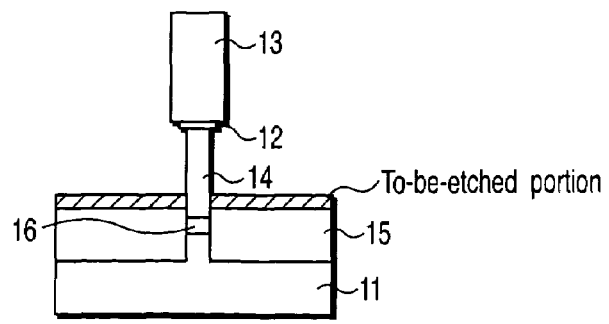
F I G. 34

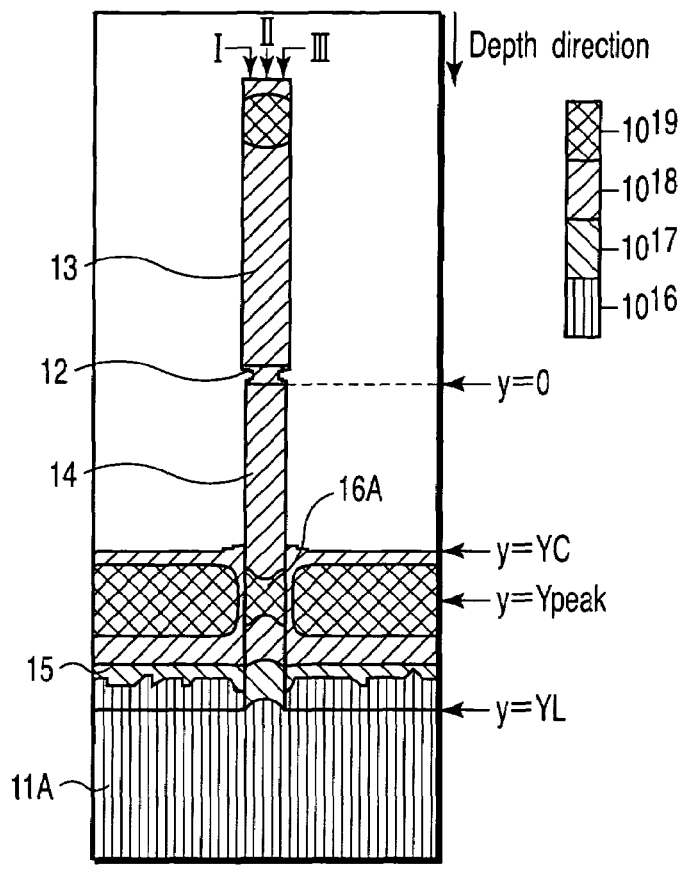
F I G. 35
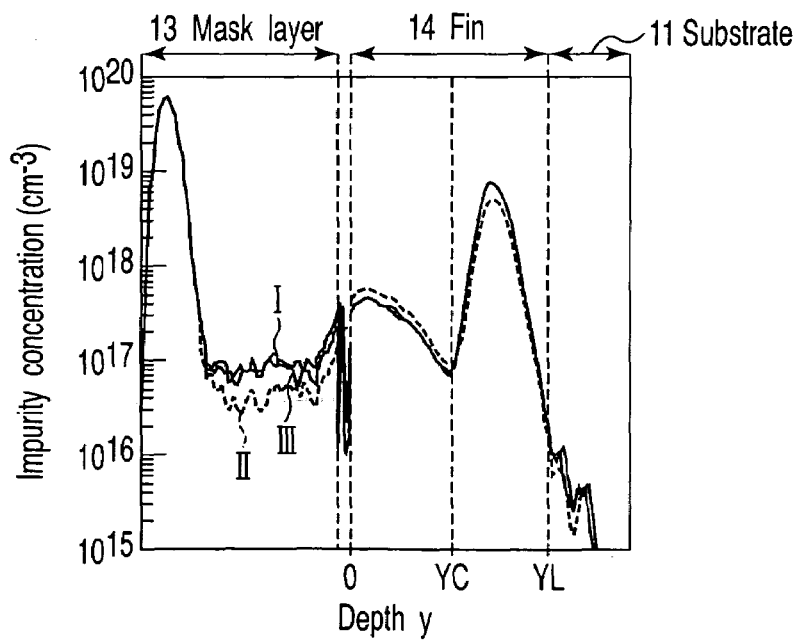
F I G. 36

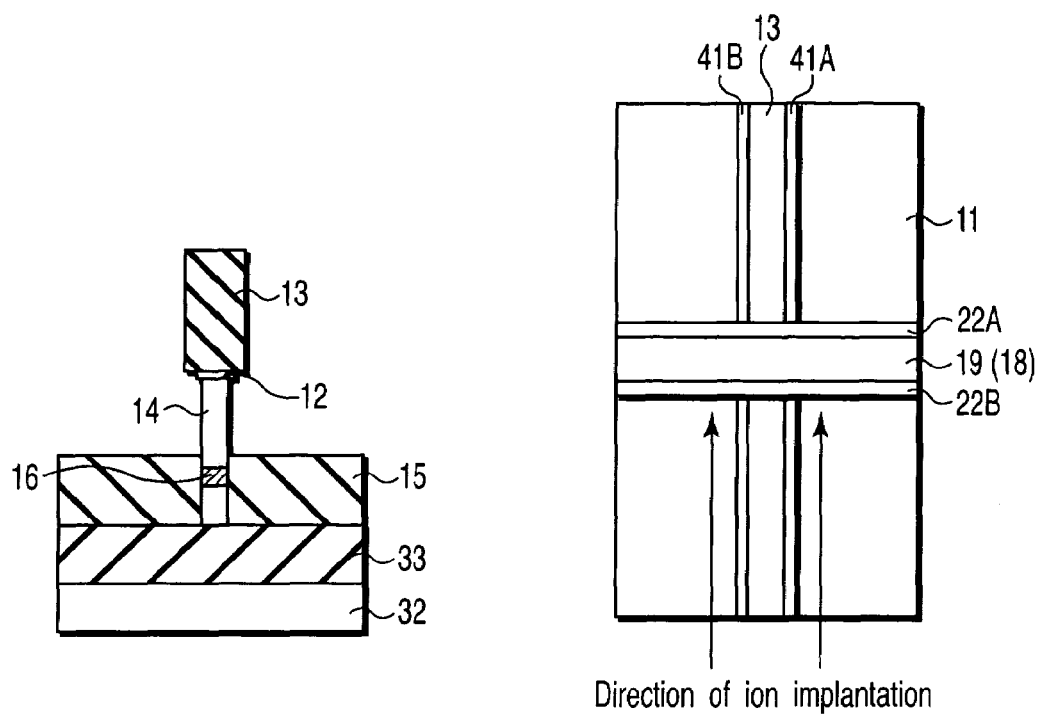
FIG. 48
FIG. 50
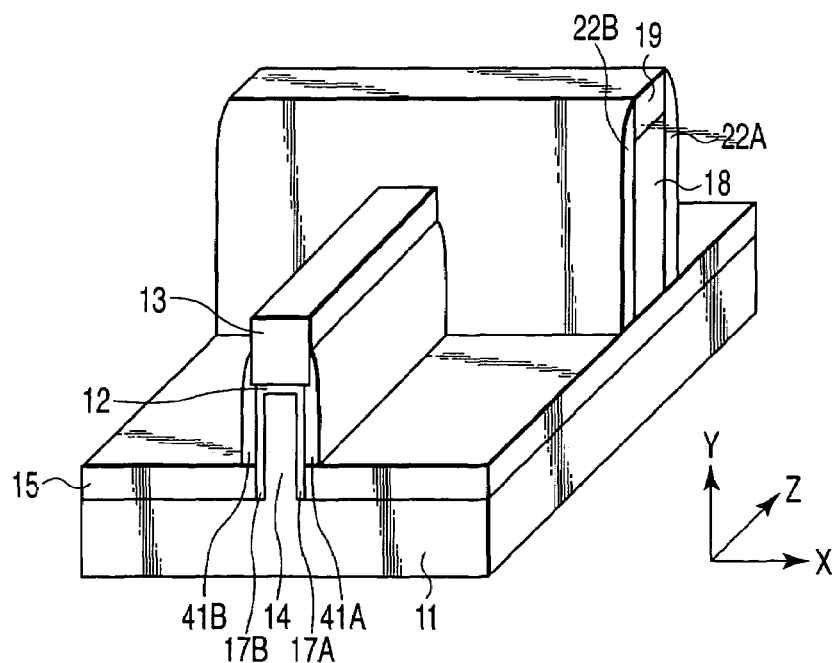
FIG. 49

SEMICONDUCTOR MANUFACTURING METHOD AND SEMICONDUCTOR DEVICE

CROSS-REFERENCE TO RELATED APPLICATIONS

This application is based upon and claims the benefit of priority from prior Japanese Patent Application No. 2005-129608, filed Apr. 27, 2005, the entire contents of which are incorporated herein by reference.

BACKGROUND OF THE INVENTION

1. Field of the Invention

The present invention relates to a method for manufacturing a semiconductor device and the semiconductor device, and more particularly to a method for manufacturing a semiconductor device having a metal oxide semiconductor field effect transistor (MOSFET) provided on a projecting semiconductor layer, and the semiconductor device.

2. Description of the Related Art

In the field of system large-scale integrated circuits (LSIs), to further enhance their performance, microfabrication of MOSFETs forming system LSIs is now being developed. In a fine MOSFET, unless the power supply voltage is low, the reliability of the MOSFET is reduced. However, when the power supply voltage is reduced, the current driving ability is reduced. To maintain the current driving ability, it is necessary to reduce the threshold voltage of the MOSFET in accordance with the reduction of the power supply voltage.

In general, when the threshold voltage is reduced, the off leakage current is increased and the gate length is reduced. In accordance with the reduction of the gate length, the short-channel effect is increased. Moreover, in accordance with the microfabrication of a MOSFET, a punch-through can easily occur between the source and drain regions of the MOSFET, thereby increasing the leakage current and degrading the cutoff characteristic.

As a MOSFET free from these problems, a fin MOSFET is known in which a projecting semiconductor layer (fin) is formed on a substrate and the opposite sides of the fin are used as channel.

In fin MOSFETs, fins are formed thin to enhance the characteristics. In these elements, the lower portion of each fin with no gate electrode thereon, which is close to the junction of each fin and substrate, is liable to be used as the current passage of a punch-through. Accordingly, it is important to suppress the forming of the punch-through.

It is desirable that fins should have an impurity profile in which the bottom portion has a high impurity concentration to suppress the leakage current, and the other portions, i.e., the channel region, contain a low concentration impurity to increase the degree of movement of carriers. It is also desirable that the substrate provided on the bottom of the fin has a low impurity concentration. This is because if the substrate has a high impurity concentration, the junction leakage current between the source/drain regions and the substrate is increased, thereby increasing the parasitic capacitance in accordance with an increase in the junction capacitance.

When impurity ions are implanted into a fin, they are implanted in a direction perpendicular to the substrate. If ions are implanted vertically, the probability of the ones of the implanted ions scattered to the ambient atmosphere being returned therefrom to the fin is low. Further, since no substances exist in the ambient atmosphere, the probability of the impurity ions scattered to the ambient atmosphere being implanted into the fin is low, too. Accordingly, the impurity concentration of the fin is inevitably lower than that of the flat portion.

Also, to make an arbitrary portion of the fin have a peak impurity concentration, impurity ions must be implanted into that portion by a high acceleration voltage. In this method, it is difficult to control the position in which the peak impurity concentration is detected, and only a gentle impurity profile is acquired.

Furthermore, it is possible to implantations into the substrate before forming the fin. In this case, however, the post process of forming the fin makes the impurity profile be gentle. Further, since ions are also implanted into the substrate, a high-impurity-concentration layer is formed in the substrate. Thus, this cannot impart an ideal concentration profile to the fin or substrate.

In addition, if two gate electrodes provided on the opposite sides of the fin are electrically disconnected from each other, the top of the fin may not be controlled by the gate electrodes, depending upon the positions of the electrodes. To avoid this, it is necessary to also form a punch-through stopper on the top of the fin. In the conventional manufacturing method, however, when a punch-through stopper is formed on the top of the fin, the impurity concentration of the channel region becomes high.

Concerning a technique related to a Fin FET, see Masaki et al., "A Fin FET Design Based on Three-Dimensional Process and Device Simulations", Toshiba Corporation, IEEE, 2003.

BRIEF SUMMARY OF THE INVENTION

According to a first aspect of the present invention, there is provided a method of manufacturing a semiconductor device, comprising: forming a mask layer on a first-conductivity-type semiconductor substrate; etching the semiconductor substrate using the mask layer as a mask, thereby forming a projecting semiconductor layer; forming a first insulating layer on the semiconductor substrate to cover a lower portion of the projecting semiconductor layer; doping a first-conductivity-type impurity into the first insulating layer, thereby forming a high-impurity-concentration layer in the lower portion of the projecting semiconductor layer; forming gate insulating films on side surfaces of the projecting semiconductor layer which upwardly extend from an upper surface of the first insulating layer; and forming a gate electrode on the gate insulating films and on the first insulating film.

According to a second aspect of the present invention, there is provided a method of manufacturing a semiconductor device, comprising: forming a mask layer on a first-conductivity-type semiconductor substrate; etching the semiconductor substrate using the mask layer as a mask, thereby forming a projecting semiconductor layer; forming a first insulating layer on the semiconductor substrate up to a top of the projecting semiconductor layer; doping a first-conductivity-type impurity into the first insulating layer, thereby forming a first high-impurity-concentration layer in an upper portion of the projecting semiconductor layer; etching the first insulating layer by a predetermined depth; forming gate insulating films on side surfaces of the projecting semiconductor layer which upwardly extend from an upper surface of the first insulating layer; and forming a gate electrode on the gate insulating films and on the first insulating layer.

According to a third aspect of the present invention, there is provided a method of manufacturing a semiconductor device, comprising: forming a mask layer on a first-conductivity-type semiconductor substrate; etching the semiconductor substrate using the mask layer as a mask, thereby forming a projecting semiconductor layer; forming a first insulating layer on the semiconductor substrate to cover a lower portion of the projecting semiconductor layer; doping a first-conductivity-type impurity into the mask layer to make the first-conductivity-type impurity reach an upper portion of the projecting semiconductor layer via the mask layer, and simultaneously doping the first-conductivity-type impurity into the first insulation, thereby forming a first high-impurity-concentration layer and a second high-impurity-concentration layer in the upper portion and the lower portion of the projecting semiconductor layer, respectively; forming gate insulating films on side surfaces of the projecting semiconductor layer which upwardly extend from an upper surface of the first insulating layer; and forming a gate electrode on the gate insulating films and on the first insulating layer.

According to a fourth aspect of the present invention, there is provided a method of manufacturing a semiconductor device, comprising: forming a projecting semiconductor layer on a substrate; forming gate insulating films on side surfaces of the projecting semiconductor layer; forming a gate electrode on the gate insulating films; forming a first side-wall insulating film and a second side-wall insulating film on opposite side surfaces of the gate electrode and on the substrate, the opposite side surfaces of the gate electrode being perpendicular to the side surfaces of the projecting semiconductor layer; and doping an impurity into the first side-wall insulating film and the second side-wall insulating film, thereby forming a first extension region and a second extension region in the projecting semiconductor layer.

According to a fifth aspect of the present invention, there is provided a semiconductor device comprising: a substrate; a projecting semiconductor layer provided on the substrate and being of first-conductive-type and having a first side surface and a second side surface opposing the first side surface; a first insulating layer provided on the substrate to cover a lower portion of the projecting semiconductor layer; gate insulating films provided on portions of the first and second side surfaces of the projecting semiconductor layer, the portions upwardly extending from the first insulating layer; a gate electrode provided on the gate insulating films and on the first insulating film; and a high-impurity-concentration layer provided in the lower portion of the projecting semiconductor layer and being of the first-conductive-type and having a higher impurity concentration than a channel region provided in the projecting semiconductor layer.

BRIEF DESCRIPTION OF THE SEVERAL VIEWS OF THE DRAWING

FIG. 6 is a sectional view illustrating a semiconductor device in which a mask layer 13 is formed of a plurality of layers;

FIG. 7 is a plan view showing a step included in the method and following the step of FIG. 5;

FIG. 8 is a sectional view taken along line B-B' of FIG. 2 and showing a step included in the method and following the step of FIG. 5;

FIG. 9 is a sectional view taken along line B-B' of FIG. 2 and showing a step included in the method and following the step of FIG. 8;

FIG. 10 is a sectional view taken along line B-B' of FIG. 2 and showing a step included in the method and following the step of FIG. 9;

FIG. 11 is a sectional view taken along line B-B' of FIG. 2 and showing a step included in the method and following the step of FIG. 10;

FIG. 12 is a sectional view illustrating an insulating layer 15 formed of a plurality of layers;

FIG. 30 is a sectional view taken along line A-A' of FIG. 2 and showing a step included in the method and following the step of FIG. 28;

FIG. 33 is a view illustrating changes in impurity concentration in the fin 14 acquired when boron is implanted as an impurity;

FIG. 34 is a sectional view taken along line B-B' of FIG. 2 and showing a semiconductor manufacturing method employed when a punch-through stopper layer 16 is provided near a gate electrode 18;

FIG. 35 is a sectional view illustrating the impurity concentration distribution of a semiconductor device according to a second embodiment of the invention;

FIG. 36 is a view illustrating the impurity concentration profile of the fin 14 appearing in FIG. 35;

FIG. 48 is a sectional view taken along line B-B' of FIG. 2 and showing a step included in the method and following the step of FIG. 47;

FIG. 49 is a perspective view useful in explaining a method for manufacturing a semiconductor device according to a sixth embodiment of the invention;

FIG. 50 is a plan view of a semiconductor device, useful in explaining a direction of ion implantation;

DETAILED DESCRIPTION OF THE INVENTION

Figure 1:
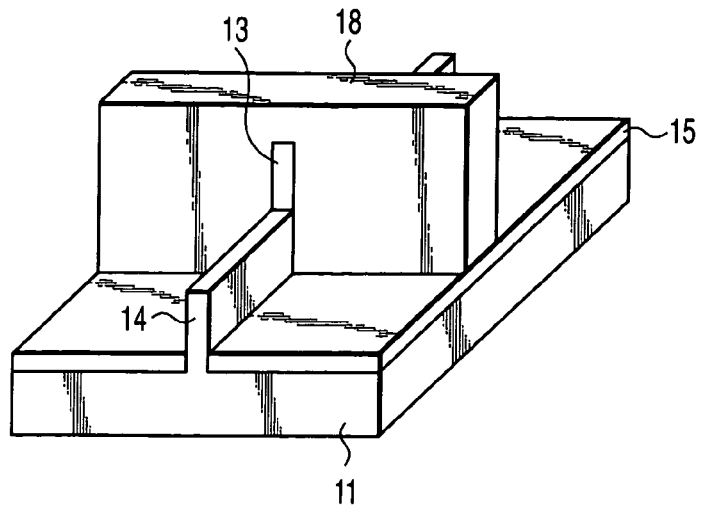
FIG. 1 is a perspective view illustrating an essential part of a semiconductor device according to a first embodiment of the invention.

Embodiments of the invention will be described with reference to the accompanying drawings. In the description below, elements having the same function and structure are denoted by the same reference numeral, and a duplicate explanation will be given only when necessary.

First Embodiment

Figure 2:
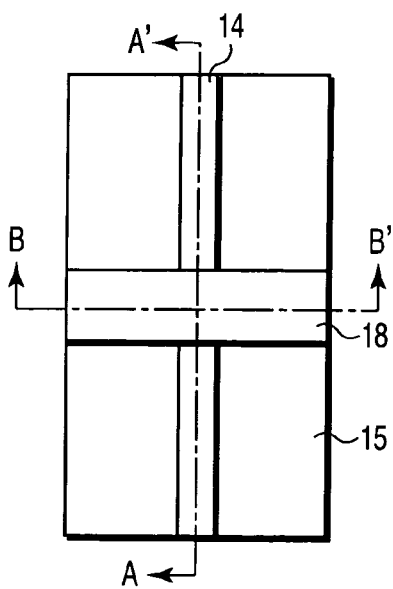
FIG. 2 is a plan view illustrating the semiconductor device of FIG. 1.
Figure 3:
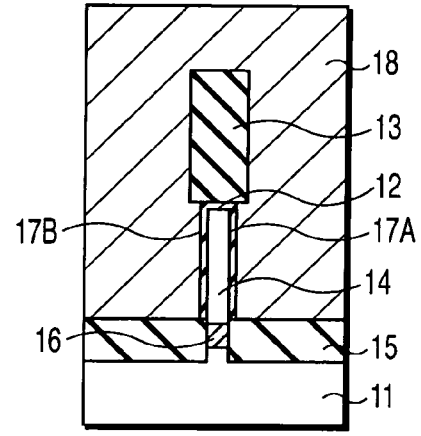
FIG. 3 is a sectional view taken along line B-B' of FIG. 2 and showing a semiconductor device.

FIG. 1 is a perspective view illustrating an essential part of a semiconductor device according to a first embodiment of the invention. FIG. 2 is a plan view illustrating the semiconductor device of FIG. 1. FIG. 3 is a sectional view taken along line B-B' of FIG. 2.

A projecting semiconductor layer 14 is provided on a P-type semiconductor substrate 11. Further, an element isolation region (shallow trench isolation (STI) region) 15 for electrically isolating elements is provided on the P-type semiconductor substrate 11, covering the lower portion of the projecting semiconductor layer 14.

Gate insulating films 17 (more specifically, 17A and 17B) are provided on opposite side surfaces of the projecting semiconductor layer 14 which upwardly extend from the element isolation region 15. A gate electrode 18 is provided on the side surfaces of the gate insulating films 17A and 17B. A high-impurity-concentration layer (punch-through stopper layer) 16 is provided in the lower portion of the projecting semiconductor layer 14 for suppressing occurrence of a punch-through. As described above, a Fin MOSFET of a double-gate structure (hereinafter referred to simply as "the Fin FET") is constructed.

Referring now to FIGS. 4 to 30, a description will be given of an example of a method for manufacturing the semiconductor device according to the first embodiment. FIGS. 20, 22, 24, 26, 28 and 30 are sectional views taken along line A-A' of FIG. 2, while FIGS. 4 to 6, 8 to 12, 15 to 19, 21, 23, 25, 27 and 29 are sectional views taken along line B-B' of FIG. 2.

Figure 4:
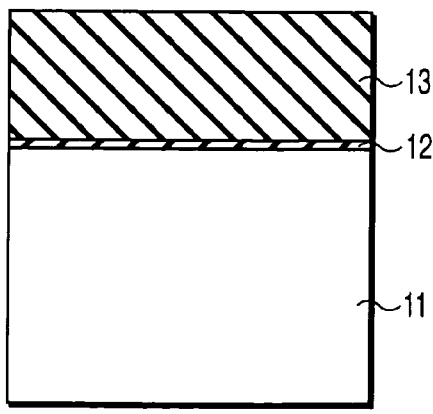
FIG. 4 is a sectional view taken along line B-B' of FIG. 2 and showing a step included in a semiconductor device manufacturing method according to a first embodiment.

Firstly, the P-type semiconductor substrate 11 as shown in FIG. 4 is prepared. In the embodiment, a bulk Si substrate is used as the P-type semiconductor substrate 11.

Figure 5:
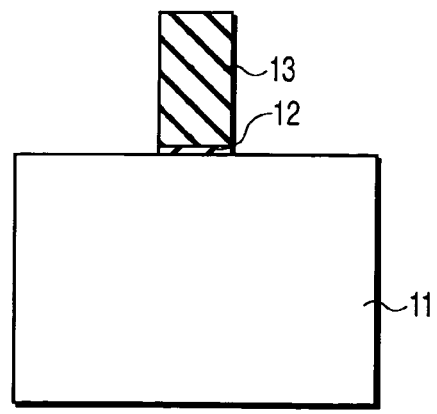
FIG. 5 is a sectional view taken along line B-B' of FIG. 2 and showing a step included in the method and following the step of FIG. 4.

On the semiconductor substrate 11, an insulating layer 12 (formed of, for example, $SiO_2$) and a mask layer 13 (formed of, for example, SiN) as an insulator are sequentially deposited using, for example, chemical vapor deposition (CVD) method. Subsequently, as shown in FIG. 5, using lithography and reactive ion etching (RIE) method, the insulating layer 12 and mask layer 13 are etched to the same plan configuration as that of the fin described later.

The mask layer 13 may be formed of a single or a plurality of layers. For instance, an SiN layer and SiO$_2$ layer may be sequentially formed on the insulating layer 12 and used as the mask layer 13 as shown in FIG. 6.

Thereafter, as shown in FIG. 7 (plan view) and FIG. 8, the semiconductor substrate 11 is etched to a desired depth by RIE method, using the mask layer 13 as a mask. As a result, the semiconductor substrate 11 is made to include the projecting semiconductor layer (hereinafter referred to "the fin") 14 and a trench.

Subsequently, as shown in FIG. 9, an insulating layer 15 is deposited on the semiconductor substrate 11 to cover the mask layer 13, by, for example, CVD method. The insulating layer 15 is formed of SiN, SiO$_2$ or tetra-ethyl-ortho-silicate (TEOS), etc. Then, as shown in FIG. 10, the insulating layer 15 is polished by chemical mechanical polishing (CMP) method to the same level as the surface of the mask layer 13, whereby the surface of the insulating layer 15 is flattened.

To make the insulating layer 15 to a desired height (or thickness) h as shown in FIG. 11, it is etched by RIE method. The height h is set lower than the top of the fin 14. As a result, the insulating layer 15 that contacts and covers the lower portion of the fin 14 is formed on the semiconductor substrate 11. The insulating layer 15 serves as an element isolation region (STI).

The insulating layer 15 may be formed of a single or a plurality of layers. For instance, an oxide film 15A may be formed by thermal oxidation on the surfaces of the semiconductor substrate 11 and fin 14, and the insulating layer 15 may be deposited on the oxide film 15A (see FIG. 12). This enables the thickness of the fin 14 to be adjusted after the fin 14 is formed, which leads to enhancement of the characteristics of a MOSFET including the fin 14.

Thereafter, a P-type impurity (i.e., a P-type impurity ions) is doped (i.e., implanted) into the insulating layer 15 to make the impurity ions diffuse into the fin 14, whereby a high-impurity-concentration layer (punch-through stopper layer) 16 is formed in the fin 14. The resultant structure is subjected to a heat treatment (annealing) for recovering crystal defects and electrically activating the implanted ions.

Ion implantation is performed with an accelerating voltage of about 5 keV at an implantation angle of about 0 degree (perpendicularly to the substrate 11), using boron as an ionic species. Further, the impurity concentration of the punch-through stopper layer 16 is set, for example, ten times or more that of each channel region.

The impurity concentration of the punch-through stopper layer 16 is set to a degree at which the stopper layer 16 is not degenerated, or set to prevent current leakage at the junction of the stopper layer and the diffusion layers (source/drain regions, extension regions). Further, the impurity concentration of the punch-through stopper layer 16 is set in light of the junction capacitance. It is desirable that the impurity concentration of the punch-through stopper layer 16 should be set to a low level falling within a range that enables a punch-through to be suppressed. Namely, it is desirable that the impurity concentration be set to a low level falling within a range that enables depletion layers included in the source and drain regions to be kept out of contact with each other in the punch-through stopper layer. Furthermore, the punch-through stopper layer 16 enables a punch-through to be sufficiently suppressed as long as the impurity concentration of the punch-through stopper layer 16 is higher (for example, twice or more) than that of the channel region.

As aforementioned, ion implantation is ideally performed perpendicularly. However, it may be performed at a certain angle, when, for example, the manufacturing apparatus requires it. It is sufficient if a large number of impurity ions are not directly implanted into the side surfaces of the fin 14. The same can be said of ion implantation processes performed later.

The accelerating voltage is set to a very low level of about 5 keV. The conditions for setting the accelerating voltage are that the peak impurity concentration should be detected in the insulating layer 15, and that the impurity ions should not pass through the insulating layer 15. More desirably, the peak impurity concentration should be detected at a quarter of the depth of the insulating layer 15 from the surface thereof.

The punch-through stopper layer 16 is formed only below the channel region. This is realized by implanting ions into the portion of the insulating layer 15 corresponding to a region in which a gate electrode is to be formed. However, depending upon the manufacturing method and/or apparatus, a high-impurity-concentration layer may be formed in a portion other than that below the channel region (i.e., the lower portions of the source and drain regions in the fin 14). Even if a high-impurity-concentration layer may be formed in the lower portions of the source and drain regions, this does not influence the characteristics of the transistor since the impurity concentration therein is sufficiently high.

Figure 13:
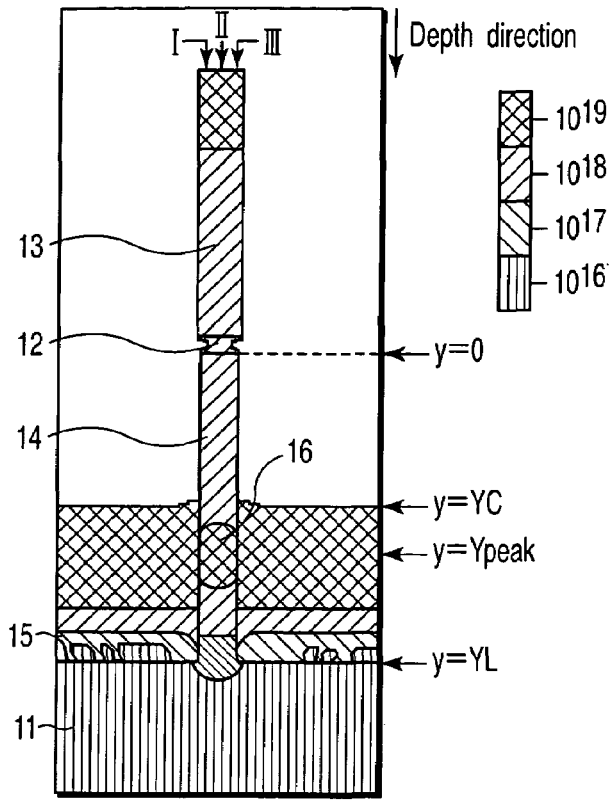
FIG. 13 is a sectional view illustrating the impurity concentration distribution of a fin 14 doped with ions.

FIG. 13 is a sectional view illustrating the impurity concentration distribution of the fin 14 doped with ions. The example of FIG. 13 uses boron as an impurity. FIG. 13 is a schematic view in which the impurity concentration is divided into four groups ($10^{19}$, $10^{18}$, $10^{17}$ and $10^{16}$ cm$^{-3}$).

Figure 14:
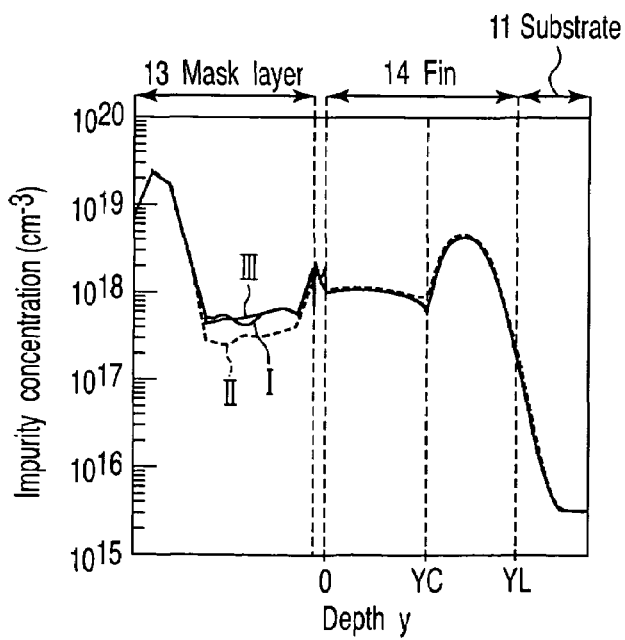
FIG. 14 is a graph illustrating the impurity concentration profile of the fin 14 shown in FIG. 13.

FIG. 14 is a graph illustrating the impurity concentration profile of the fin 14 shown in FIG. 13. The abscissa indicates the depth y, and the ordinate indicates the impurity concentration (cm$^{-3}$). Specifically, FIG. 14 shows impurity profiles assumed at three positions I, II and III in FIG. 13. Position I corresponds to the left portion of the fin 14, position II corresponds to the central portion of the fin 14, and position III corresponds to the right portion of the fin 14.

As shown in FIGS. 13 and 14, the high-impurity-concentration layer 16 is formed in the fin 14 at the depth at which boron exhibits a peak concentration. The high-impurity-concentration layer 16 is used as a punch-through stopper layer for suppressing a punch-through. It is understood from the figures that the punch-through stopper layer 16 has an impurity concentration ten times or more that of the channel region in the fin 14. It is also understood that the impurity concentration little vary at the three positions I, II and III. Namely, the impurity concentration little varies at the same depth in the fin 14.

The peak impurity concentration of the punch-through stopper layer 16 is substantially identical to that of the insulating layer 15. Furthermore, the peak impurity concentration position in the punch-through stopper layer 16 is substantially identical to that in the insulating layer 15.

When ions are implanted into the insulating layer 15, the mask layer 13 is also doped with ions. Accordingly, when the punch-through stopper layer 16 is only formed in the lower portion of the fin 14 as in the embodiment, the mask layer 13 is set to a thickness that prevents the impurity ions from reaching the fin 14 therethrough.

Figure 15:
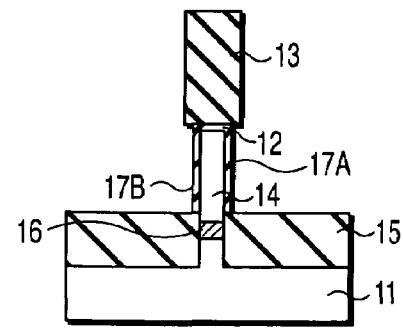
FIG. 15 is a sectional view taken along line B-B' of FIG. 2 and showing a step included in the method and following the step of FIG. 11.
Figure 16:
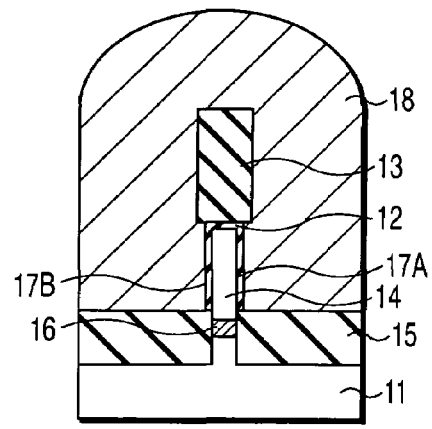
FIG. 16 is a sectional view taken along line B-B' of FIG. 2 and showing a step included in the method and following the step of FIG. 15.

After that, the opposite sides of the fin 14 are thermally oxidized, thereby forming gate insulating films 17A and 17B on the opposite sides as shown in FIG. 15. Subsequently, as shown in FIG. 16, a conductor (e.g. polysilicon doped with an N$^-$-type impurity) 18 is deposited by, for example, CVD method, on the insulating layer 15 to cover the mask layer 13.

Figure 17:
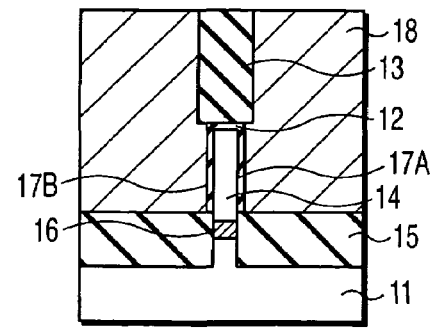
FIG. 17 is a sectional view taken along line B-B' of FIG. 2 and showing a step included in the method and following the step of FIG. 16.
Figure 18:
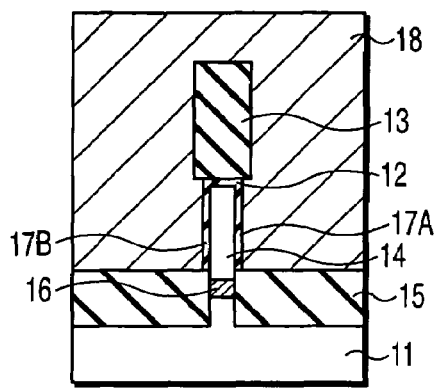
FIG. 18 is a sectional view taken along line B-B' of FIG. 2 and showing a step included in the method and following the step of FIG. 17.

The polysilicon layer 18 is polished by CMP method to the same level as the surface of the mask layer 13, whereby it is flattened, as is shown in FIG. 17. Polysilicon is again deposited as shown in FIG. 18. Thus, the flat polysilicon layer 18 is formed.

Figure 19:
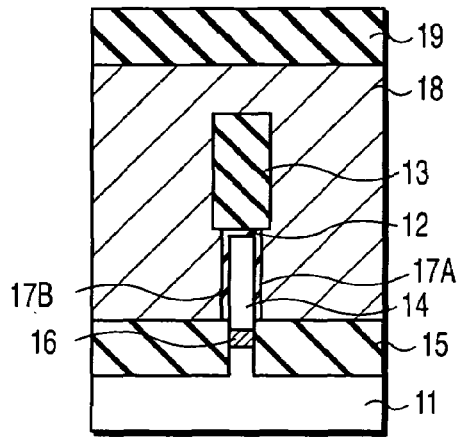
FIG. 19 is a sectional view taken along line B-B' of FIG. 2 and showing a step included in the method and following the step of FIG. 18.
Figure 20:
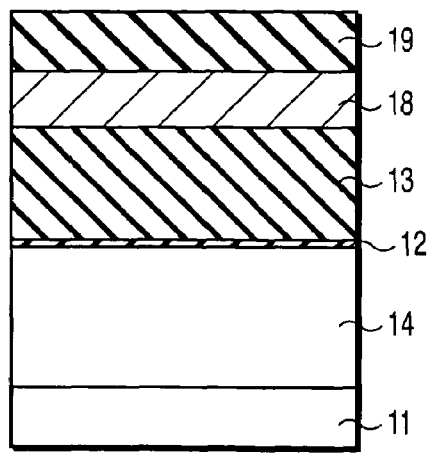
FIG. 20 is a sectional view taken along line A-A' of FIG. 2 and showing the step included in the method and following the step of FIG. 18.

An insulating layer 19 formed of, e.g., SiN is deposited on the polysilicon layer 18 as shown in FIGS. 19 and 20. Then, using lithography, a mask (not shown) having the same plan configuration as a gate electrode is formed on the insulating layer 19, as shown in FIGS. 19 and 20.

Figure 21:
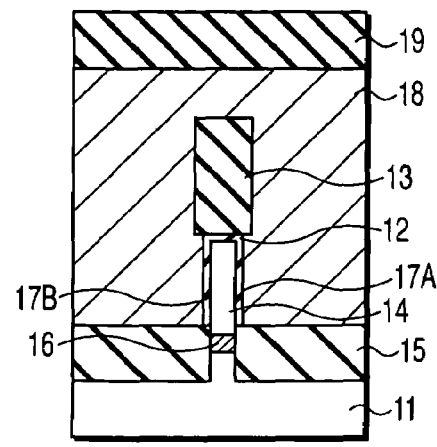
FIG. 21 is a sectional view taken along line B-B' of FIG. 2 and showing a step included in the method and following the step of FIG. 19.
Figure 22:
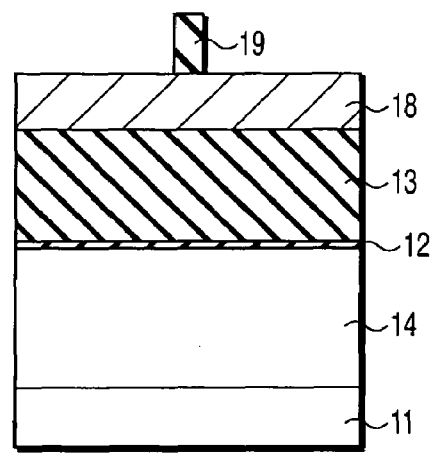
FIG. 22 is a sectional view taken along line A-A' of FIG. 2 and showing a step included in the method and following the step of FIG. 20.

Thereafter, using the mask, the insulating layer 19 is etched by RIE method to the same level as the surface of the polysilicon layer 18, as shown in FIGS. 21 and 22. Thus, a hard mask layer 19 is formed on the polysilicon layer 18. The hard mask layer 19 will later serve as a gate gap insulating film.

Figure 23:
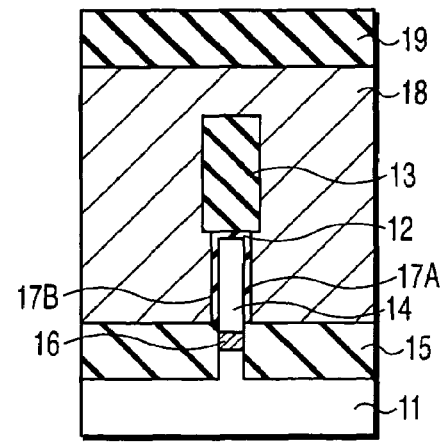
FIG. 23 is a sectional view taken along line B-B' of FIG. 2 and showing a step included in the method and following the step of FIG. 21.
Figure 24:
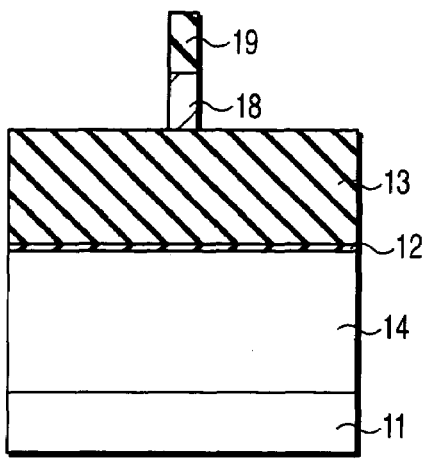
FIG. 24 is a sectional view taken along line A-A' of FIG. 2 and showing a step included in the method and following the step of FIG. 22.

Using the hard mask layer 19 as a mask, the polysilicon layer 18 is etched by RIE method to the same level as the surface of the STI 15 as shown in FIGS. 23 and 24. Thus, the gate electrode 18 is formed on the opposite sides of the fin 14 (double gate structure).

Subsequently, offset spacers (side-wall insulating films for offset) 20A and 20B, which are formed of, for example, SiN and used to form extension regions, are formed, by, for example, CVD method and RIE method, on opposite sides of the gate electrode 18 extending in the longitudinal direction of the fin 14. Using the offset spacers 20A and 20B as masks, N-type impurity ions (e.g., arsenic ions) are implanted into the fin 14, thereby forming extension regions 21A and 21B.

The extension regions 21A and 21B are provided for relaxing the channel electric field. The extension regions 21A and 21B suppress the short-channel effect of the transistor, and enhance the current driving ability.

Figure 27:
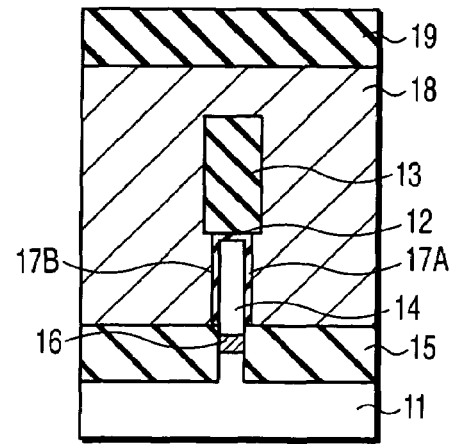
FIG. 27 is a sectional view taken along line B-B' of FIG. 2 and showing a step included in the method and following the step of FIG. 25.
Figure 25:
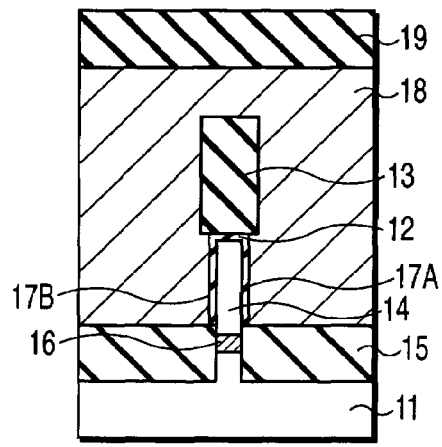
FIG. 25 is a sectional view taken along line B-B' of FIG. 2 and showing a step included in the method and following the step of FIG. 23.
Figure 28:
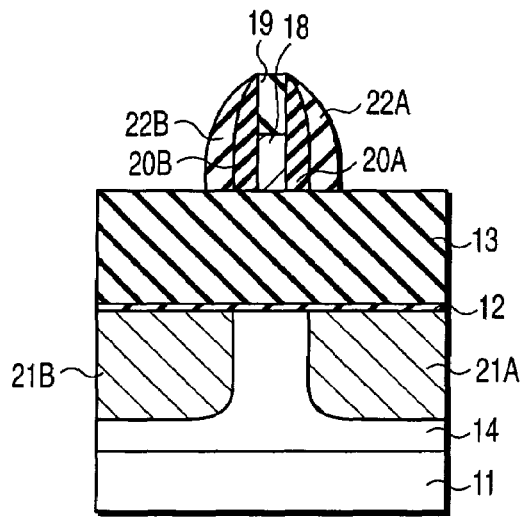
FIG. 28 is a sectional view taken along line A-A' of FIG. 2 and showing a step included in the method and following the step of FIG. 26.
Figure 26:
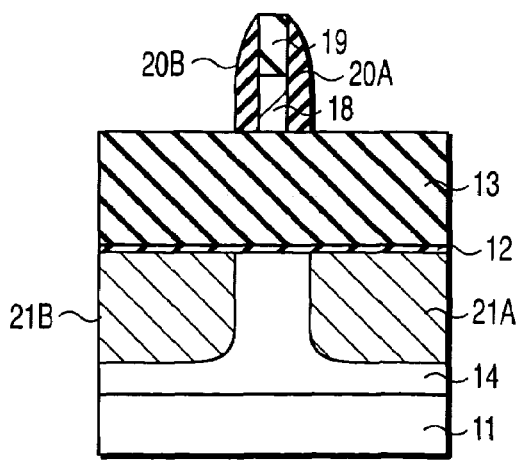
FIG. 26 is a sectional view taken along line A-A' of FIG. 2 and showing a step included in the method and following the step of FIG. 24.
Figure 29:
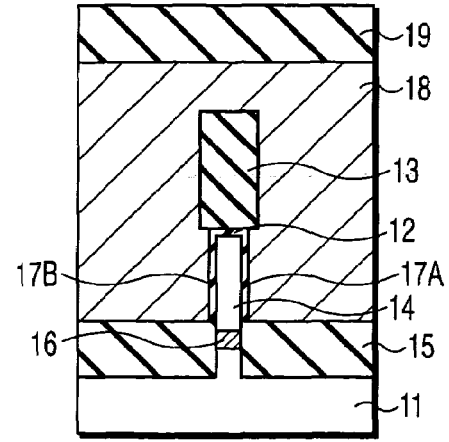
FIG. 29 is a sectional view taken along line B-B' of FIG. 2 and showing a step included in the method and following the step of FIG. 27.

Thereafter, as shown in FIGS. 27 and 28, the opposite sides (i.e., offset spacers 20A and 20B) of the gate electrode 18 are subjected to, for example, CVD method and RIE method to thereby form spacers (gate side-wall insulating films) 22A and 22B formed of, for example, SiN. After that, the mask layer 13 and insulating layer 12 are etched by RIE method to the same level as the surface of the fin 14, using the spacers 22A and 22B as masks, as shown in FIGS. 29 and 30.

Using the spacers 22A and 22B as masks, N$^+$-type impurity (e.g., boron) ions of a high concentration are implanted into the fin 14, thereby forming a source region 23A and drain region 23B in the fin 14. Thus, a Fin FET is acquired.

In each channel region of the MOSFET, it is desirable that the impurity be of a low concentration. This is because the channel electric field is relaxed if the impurity concentration of the channel region is low, with the result that the degree of movement of carriers can be enhanced (or the drain current can be increased).

Further, it is desirable that the impurity concentration of the deep portion (lower portion) of the fin 14 be high. This is because if the lower portion of the fin 14 has a high impurity concentration (i.e., a high-impurity-concentration punch-through stopper layer is formed), a punch-through that can easily occur in the lower portion of the fin 14 can be suppressed, and the leakage current can be reduced. The Fin FET according to the first embodiment satisfies these two conditions.

Figure 31:
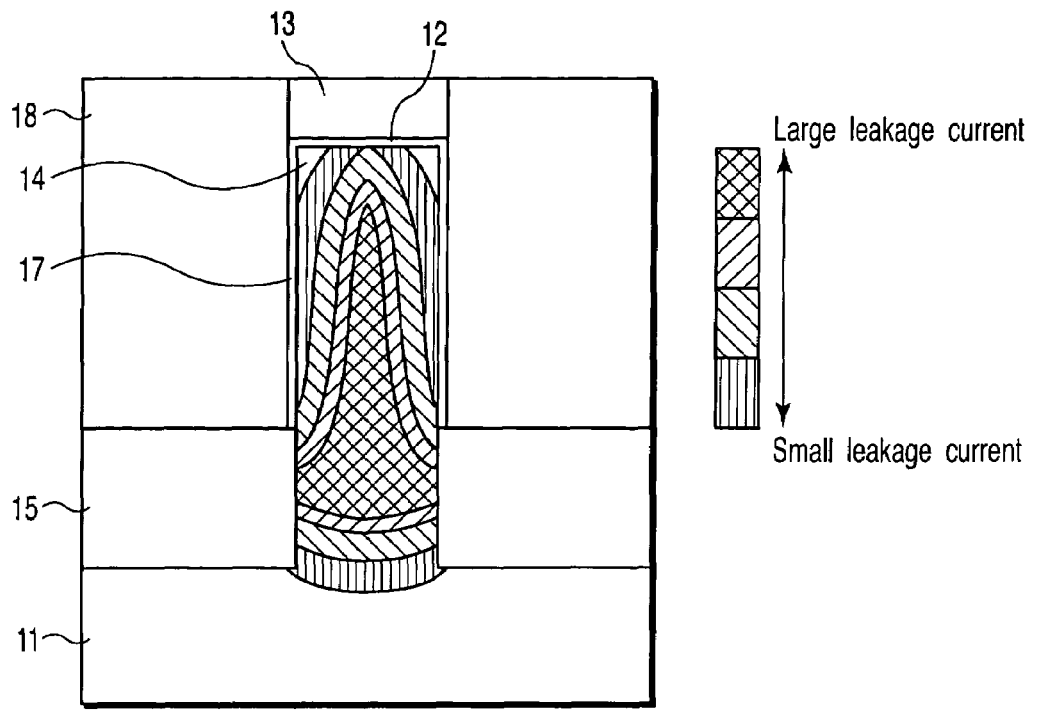
FIG. 31 is a view illustrating a leakage current density distribution assumed when the impurity concentration is constant in the depth direction of the fin 14.
Figure 32:
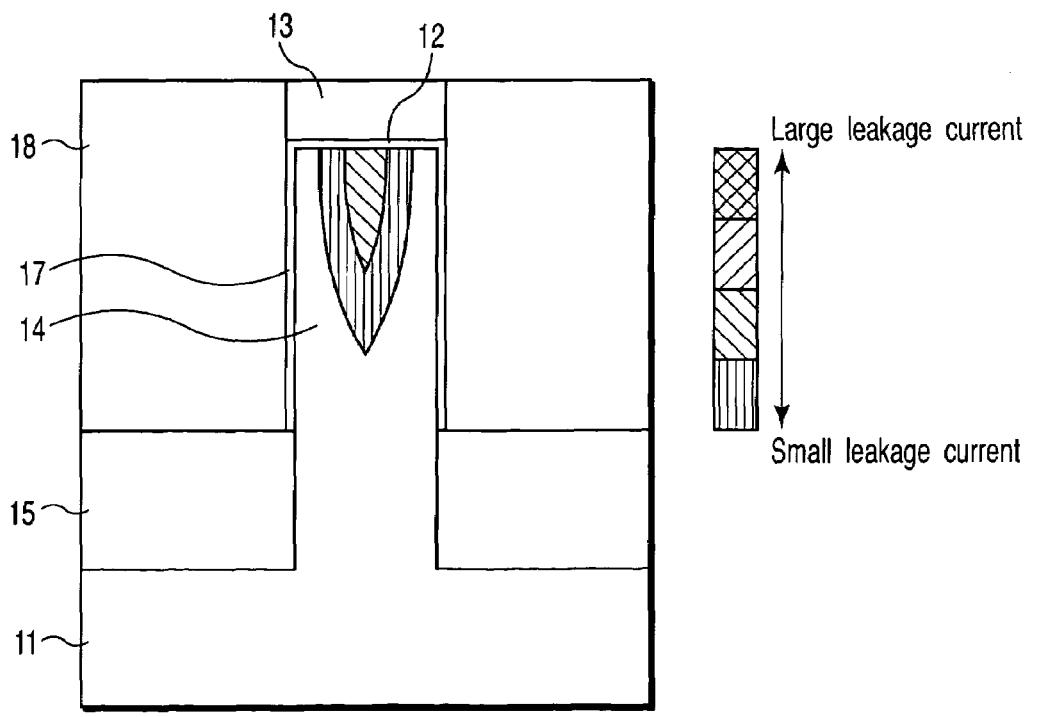
FIG. 32 is a view illustrating the leakage current density distribution of a Fin FET according to the first embodiment.

FIG. 31 is a view illustrating a leakage current density distribution assumed when the impurity concentration is constant in the depth direction of the fin 14 (in the embodiment, the concentration of boron is $2 \times 10^{17}$ (cm$^{-3}$)). FIG. 32 is a view illustrating the leakage current density distribution of the Fin FET according to the first embodiment.

As can be understood from FIG. 31, if the impurity concentration is constant in the depth direction of the fin 14, the leakage current in the fin 14 (in particular, in the lower portion of the fin 14 below the channel region) is large. On the other hand, as can be understood from FIG. 32, the leak current in the fin 14 can be reduced by the punch-through stopper layer 16 formed below the channel region.

FIG. 33 is a view illustrating changes in impurity concentration in the fin 14 acquired when boron is implanted as an impurity. In FIG. 33, the abscissa indicates the depth/peak-depth, and the ordinate indicates the concentration/peak-concentration. In this case, the peak-depth means the depth at which the peak concentration is detected. The position of the top of the fin 14 is set to y=zero, and the position of the peak-depth is set to y=Ypeak. FIG. 33 also shows changes in impurity concentration that occur in conventional Fin FETs formed using different accelerating voltages (ene). Further, the thickness of the mask layer 13 is set to 100 nm. The thickness of the insulating layer 12 is set to 2 nm.

As is evident from FIG. 33, in the conventional cases, the impurity concentration C (y=Ypeak/2) at a depth y=Ypeak/2 is higher than a peak concentration of 60%. The impurity concentration profile is determined by thermal diffusion after ion implantation. Since boron is diffused by a heat treatment, the impurity concentration C (y=Ypeak/2)>0.6 C (y=Ypeak), which means a reduction in the degree of movement of carriers in the channel region. Furthermore, in the conventional cases, after diffusion, C (y>YL)>C (y=YC). Thus, the impurity concentration C (y=YC) is not close to the peak concentration, therefore the leakage current at the junctions is increased.

However, in the impurity concentration profile of the Fin FET of the embodiment, C (y=YC)<C (y=Ypeak)<C (y=YL), and the impurity concentration at y=Ypeak/2 is lower than a peak concentration of 20%. Namely, the impurity concentration is not more than ⅓, compared to the conventional cases.

Also in the embodiment, even after diffusion, C (y=YC) <0.2C (y=Ypeak), thereby increasing the degree of movement of carriers in the channel region, and at the same time, C (y=YL)<0.2C (y=Ypeak), thereby suppressing the leak current at the junctions.

In addition, in the impurity concentration profile of the Fin FET of the embodiment, an abrupt concentration change occurs between the channel region and the punch-through stopper layer. This means that a high-impurity-concentration layer can be formed in a small region of the fin 14 located in the depth direction. Accordingly, large channel region can be formed, and a MOSFET of high performance can be formed.

As described above in detail, in the first embodiment, the punch-through stopper layer 16 having a higher impurity concentration than the channel region can be formed below the channel region. Namely, occurrence of a punch-through in the Fin FET can be suppressed, and the leakage current can be reduced.

Furthermore, in the manufacturing method of the embodiment, since the punch-through stopper layer 16 is formed close to the surface of the STI 15, the channel region of the Fin FET and the punch-through stopper layer 16 can be formed by self-alignment. Namely, without using lithography, the channel region and punch-through stopper layer 16 can be formed simultaneously.

The relative positional relationship between the gate electrode 18 and the punch-through stopper layer 16 can be set arbitrarily. Specifically, after ion implantation for forming the punch-through stopper layer 16 (i.e., in the state shown in FIG. 11), the STI 15 is etched by RIE method by several nanometers to lower the surface level of the STI 15 (see FIG. 34).

After that, the gate insulating films 17A and 17B and gate electrode 18 are formed. As a result, the punch-through stopper layer 16 is located close to the gate electrode 18. This structure further effectively suppresses the occurrence of a punch-through.

Second Embodiment

In a second embodiment of the invention, an N-type semiconductor substrate is used, and arsenic ions are implanted into the fin of the N-type semiconductor substrate to form a punch-through stopper layer.

The first embodiment using the P-type semiconductor substrate 11 is characterized in that impurity ions are implanted into both the fin 14 and the STI 15 surrounding the lower portion of the fin 14 as shown in FIG. 13, and the lower portion and STI 15 have substantially the same peak impurity concentration.

In the second embodiment, an N-type semiconductor substrate 11A, and arsenic ions as N-type impurity ions are implanted into a fin 14 on the N-type semiconductor substrate 11A. FIG. 35 is a sectional view illustrating the impurity concentration distribution of the semiconductor device of the second embodiment. FIG. 36 is a view-illustrating the impurity concentration profile of the fin 14 appearing in FIG. 35.

When arsenic ions are implanted, arsenic ions in the STI 15 are moved into the fin 14 during a heat treatment (annealing) as a result of segregation from the oxide film. This is a phenomenon opposite to that occurring in the case of using boron. Accordingly, the peak impurity concentration of a high-impurity-concentration layer (punch-through stopper layer) 16A formed in the fin 14 is increased, thereby exhibiting a more abrupt impurity concentration profile than in the case of using boron.

Figure 37:
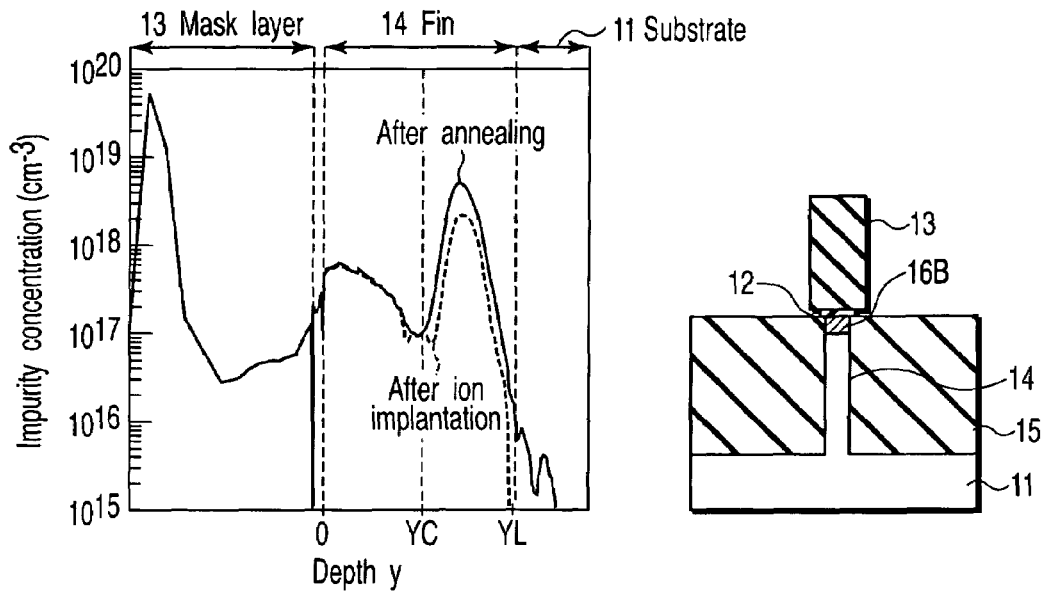
FIG. 37 is a view illustrating impurity concentration profiles acquired after ion implantation and after annealing.

FIG. 37 is a view illustrating impurity concentration profiles acquired after ion implantation and after annealing. As can be understood from FIG. 37, arsenic ions are moved from the STI 15 to the fin 14 after annealing, thereby increasing the peak concentration of the punch-through stopper layer 16A.

Further, since impurity ions in the high-impurity-concentration layer are diffused up to the surface of the STI 15, the punch-through stopper layer 16A is enlarged toward the gate electrode. As a result, the punch-through stopper layer 16A can have a better impurity concentration profile than in the case of using boron.

Third Embodiment

In a third embodiment of the invention, two punch-through stopper layers are formed in the fin 14. A method for manufacturing a semiconductor device according to a third embodiment will be described below. In the third embodiment, firstly, the same process steps as shown in FIGS. 1 to 10 are performed.

Figure 38:
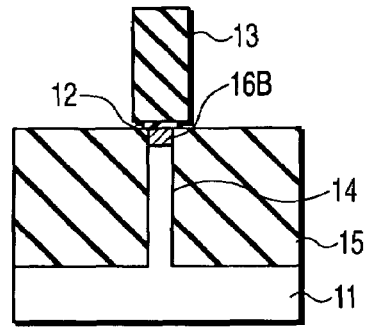
FIG. 38 is a sectional view taken along line B-B' of FIG. 2 and showing a semiconductor device manufacturing method according to a third embodiment of the invention.

Subsequently, as shown in FIG. 38 (a sectional view taken along B-B' of FIG. 2), the insulating film 15 is etched by RIE method to the same level as the top of the fin 14. Then, P-type impurity ions are implanted into the insulating layer 15 and diffused to the upper portion of the fin 14. As a result, a first punch-through stopper layer 16B is formed in the upper portion of the fin 14.

Ion implantation is performed with an accelerating voltage of about 5 keV at an implantation angle of 0 degree (i.e., perpendicular to the substrate 11), using, for example, boron as an ion species. The accelerating voltage is set to a very low level of about 5 keV. Thus, the punch-through stopper layer 16B is formed. The resultant structure is annealed for recovering crystal defects and electrically activating the implanted ions. Annealing may be performed after a second punch-through stopper layer 16, described later, is formed.

Subsequently, to make the insulating layer 15 to a desired height (or thickness) h as shown in FIG. 11, it is etched by RIE method. The height h is set lower than the top of the fin 14. As a result, the insulating layer (STI) 15 is formed on the semiconductor substrate 11.

Ions are implanted into the STI 15 to form the second punch-through stopper layer 16, under the same conditions as the above (i.e., with an accelerating voltage of about 5 keV at an implantation angle of 0 degree (i.e., perpendicular to the substrate 11), using, for example, boron as an ion species). The resultant structure is annealed for recovering crystal defects and electrically activating the implanted ions. The process steps performed after this are similar to those in the first embodiment.

Figure 39:
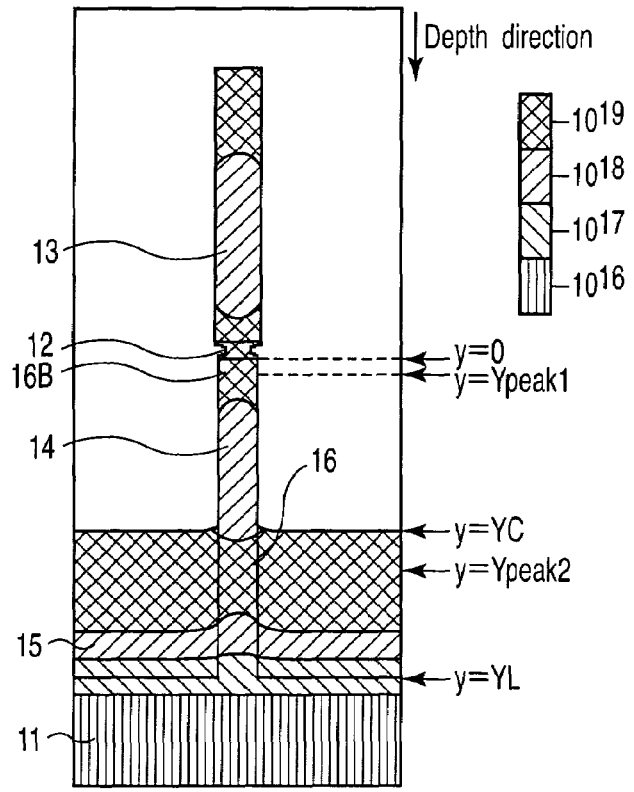
FIG. 39 is a sectional view illustrating the boron concentration profile of the fin 14 doped with boron.
Figure 40:
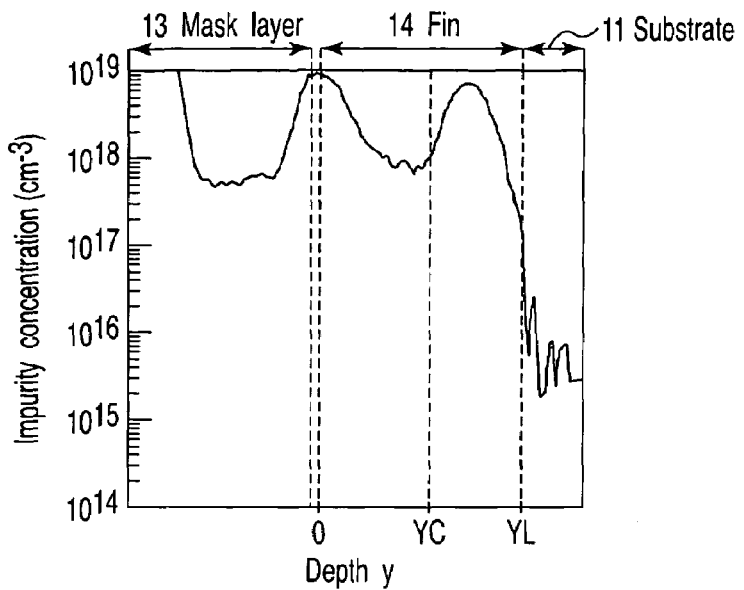
FIG. 40 is a graph illustrating the impurity concentration profile of the fin 14 shown in FIG. 39.

FIG. 39 is a sectional view illustrating the boron concentration profile of the fin 14 doped with boron. FIG. 40 is a graph illustrating the impurity concentration profile of the fin 14. The abscissa indicates the depth y, and the ordinate indicates the impurity concentration ($cm^{-3}$).

As shown in FIGS. 39 and 40, the first and second punch-through stopper layers 16B and 16 are formed in the upper portion (depth y=Ypeak1) and the lower portion (depth y=Ypeak2) of the fin 14, respectively. The punch-through stopper layers 16B and 16 have an impurity concentration ten times or more that of the channel region of the fin 14.

Figure 41:
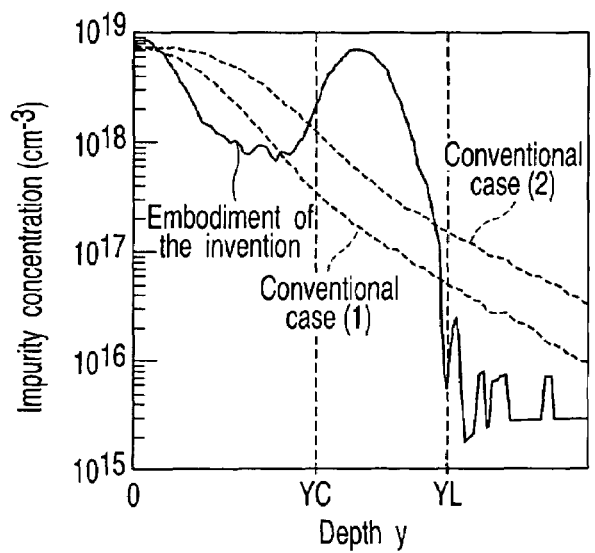
FIG. 41 is a view useful in comparing the impurity concentration profile of the third embodiment with a conventional one.

FIG. 41 is a view useful in comparing the impurity concentration profile of the third embodiment with a conventional one. FIG. 41 shows the impurity concentration profile ($y \geq 0$) of the fin 14, and those of conventional examples (1) and (2).

In the conventional cases, when a punch-through stopper layer is formed in the upper portion of the fin 14, impurity ions are applied to, for example, the mask layer 13 with a high accelerating voltage. The conventional example (1) in FIG. 41 is an impurity concentration profile acquired when boron ions are applied with an accelerating voltage of about 30 keV. The conventional example (2) in FIG. 41 is an impurity concentration profile acquired when boron ions are applied with an accelerating voltage of about 35 keV.

As can be understood from FIG. 41, in the conventional examples (1) and (2), a high-impurity-concentration layer is formed at the depth y=0, and the impurity concentration gradually reduces as the depth increases. In contrast, in the second embodiment, the punch-through stopper layer 16B having an abrupt impurity concentration profile can be formed in the upper portion of the fin 14.

Figure 42:
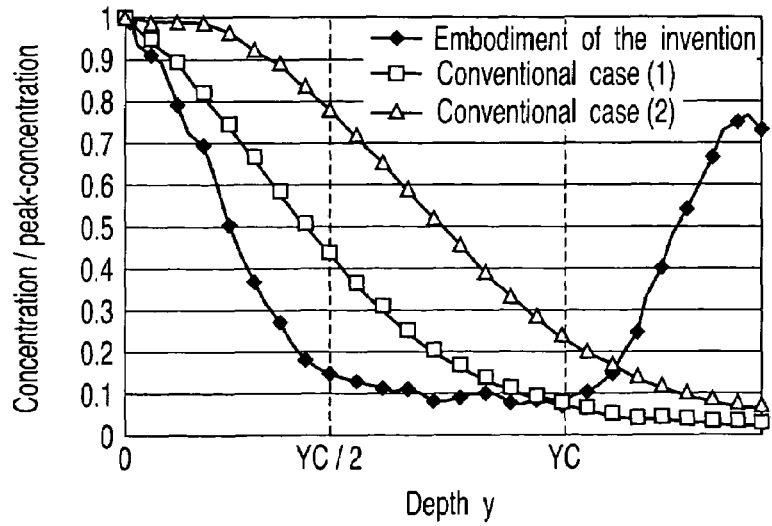
FIG. 42 is a graph illustrating changes in the impurity concentration of the fin 14 when boron is used as the impurity.

FIG. 42 is a graph illustrating changes in the impurity concentration of the fin 14 when boron is used as the impurity. In FIG. 42, the abscissa indicates the depth, and the ordinate indicates the concentration/peak-concentration. As shown in FIG. 42, in the Fin FETs of the conventional examples (1) and (2), the impurity concentration C (y=YC/2) is higher than 40% of the impurity concentration C (y=0).

In contrast, in the Fin FET of the third embodiment, the impurity concentration C (y=YC/2) is lower than 20% of the impurity concentration C (y=0). Namely, the impurity concentration of the channel region is half or less that of the conventional cases. This increases the degree of movement of carriers.

Furthermore, in the third embodiment, a change in impurity concentration between the channel region and the punch-through stopper layer is very large. This means that only a small region in the fin 14 can provide an effective punch-through stopper layer.

As described in detail, in the Fin FET of the third embodiment, occurrence of a punch-through in the upper portion of the fin 14 can be suppressed, thereby enhancing controllability by the gate electrode 18. The third embodiment can further provide the same advantages as acquired by the first embodiment.

In addition, there is a Fin FET in which two gate electrodes provided on the opposite sides of the fin are electrically disconnected from each other. In this Fin FET, the control by the gate electrode may not cover the top of the fin, depending upon the position of the gate electrode. However, if a punch-through stopper layer is also formed in the upper portion of the fin 14 as in the third embodiment, occurrence of a punch-through in the upper portion of the fin 14 is suppressed.

Although in the third embodiment, the upper and lower portions of the fin 14 are provided with punch-through stopper layers, only the upper portion may be provided with a punch-through stopper layer.

Fourth Embodiment

In a fourth embodiment, two punch-through stopper layers are formed in the fin 14 by adjusting the accelerating voltage applied to an impurity. A method for manufacturing a semiconductor device according to a fourth embodiment will be described. In the fourth embodiment, firstly, the same process steps as shown in FIGS. 1 to 11 are performed.

Figure 43:
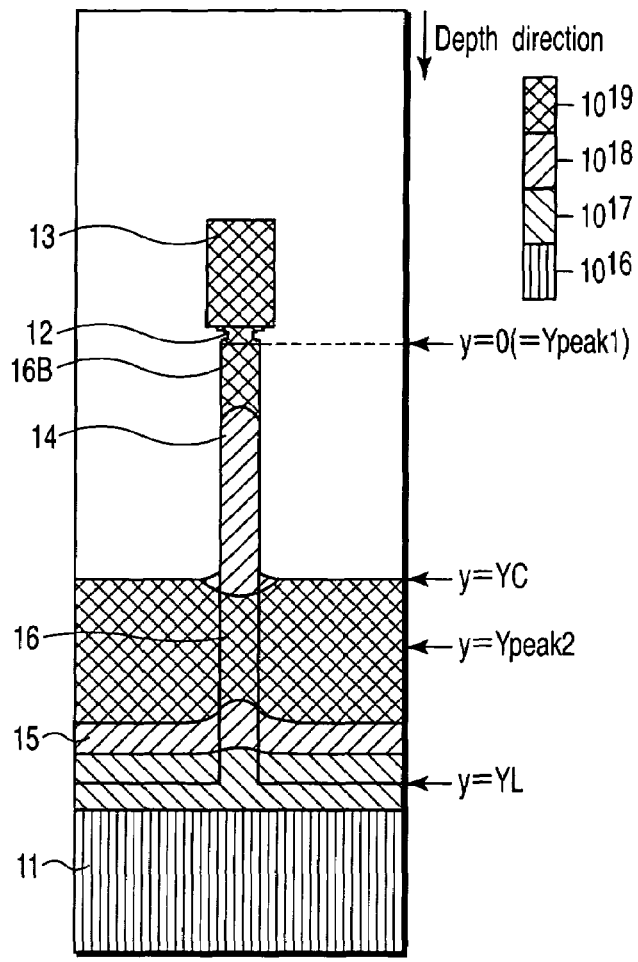
FIG. 43 is a sectional view illustrating the impurity concentration distribution of a fin 14 doped with ions according to a fourth embodiment of the invention.

Subsequently, part of the mask layer 13 is etched from above, and ions, e.g. boron ions, are implanted with a high accelerating voltage into the mask layer 13 and insulating layer 15. Ion implantation is performed perpendicularly to the substrate. FIG. 43 is a sectional view illustrating the impurity concentration distribution of a fin 14 doped with ions. As shown in FIG. 43, the boron ions passing through the mask layer 13 form a first punch-through stopper layer 16B in the upper portion (depth y=Ypeak1) of the fin 14.

Further, the boron ions implanted into the insulating layer 15 are diffused into the fin 14, thereby forming a second punch-through stopper layer 16 in the lower portion (depth y=Ypeak2) of the fin 14. The resultant structure is subjected to annealing for recovering crystal defects and electrically activating the implanted ions.

In the ion implantation process in the fourth embodiment, the accelerating voltage is controlled so that the impurity ions will pass through the mask layer 13 but will not punch through the insulating layer 15. Further, to satisfy this condition, part of the mask layer 13 is etched as mentioned above to adjust the thickness thereof.

As described above in detail, in the fourth embodiment, the punch-through stopper layers 16 and 16B can be formed in the lower and upper portions of the fin 14, respectively, by a single ion implantation process. As a result, occurrence of a punch-through in the upper and lower portions of the fin 14 can be suppressed.

Fifth Embodiment

In a fifth embodiment, a Fin FET is formed using a substrate of a silicon-on-insulator (SOI) structure as a semiconductor substrate.

Referring to FIGS. 44 to 48, a description will be given of an example of a method for manufacturing a semiconductor device according to the fifth embodiment. FIGS. 44 to 48 are sectional views taken along B-B' in FIG. 2.

Figure 44:
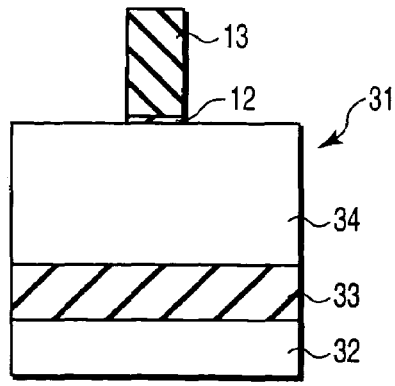
FIG. 44 is a sectional view taken along line B-B' of FIG. 2 and showing a step included in a semiconductor device manufacturing method according to a fifth embodiment of the invention.

Firstly, as shown in FIG. 44, an SOI substrate 31 having an SOI structure is prepared. Specifically, the SOI substrate 31 comprises a support substrate 32, an insulating layer (e.g., a buried oxide (BOX) layer) 33 on the substrate 32, and a SOI layer 34 provided as a P-type semiconductor layer on the BOX layer 33.

Figure 45:
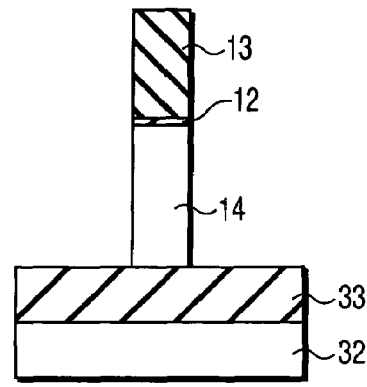
FIG. 45 is a sectional view taken along line B-B' of FIG. 2 and showing a step included in the method and following the step of FIG. 44.

Subsequently, an insulating layer 12 and mask layer 13 are formed on the SOI layer 34. Further, as shown in FIG. 45, the SOI layer 34 is etched to the same level as the surface of the BOX layer 33 by, for example, RIE method, using the mask layer 13 as a mask. As a result, a projecting semiconductor layer (fin) 14 and trench are simultaneously formed on the BOX layer 33. The BOX layer 33 serves as an element isolation region.

Figure 46:
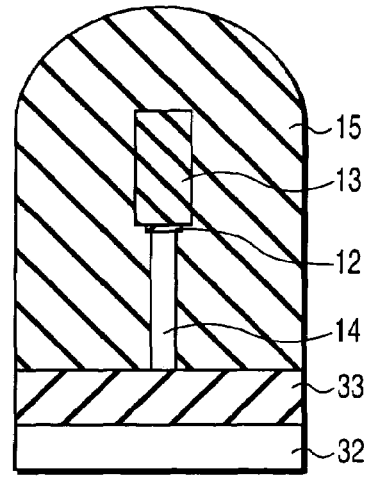
FIG. 46 is a sectional view taken along line B-B' of FIG. 2 and showing a step included in the method and following the step of FIG. 45.
Figure 47:
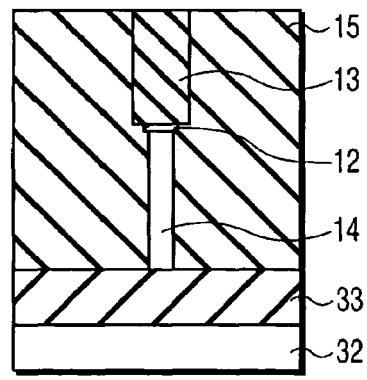
FIG. 47 is a sectional view taken along line B-B' of FIG. 2 and showing a step included in the method and following the step of FIG. 46.

Thereafter, as shown in FIG. 46, an insulating layer 15 is deposited on the BOX layer 33 to cover the mask layer 13. The resultant structure is polished by CMP method to the same level as the surface of the mask layer 13 as shown in FIG. 47.

After that, as shown in FIG. 48, the insulating layer 15 is etched by RIE method to a desired height h. P-type ions are implanted into the insulating layer 15, and diffused into the fin 14. As a result, a punch-through stopper layer 16 is formed in the fin 14. This ion implantation process is similar to that of the first embodiment.

Subsequently, gate insulating films 17A and 17B, gate electrode 18, source region 23A and drain region 23B are formed. The processes for forming these elements are also similar to those of the first embodiment. Thus, a Fin FET of a double-gate structure, using an SOI substrate, is provided.

In the fifth embodiment, the insulating layer 15 is used to enable a portion of the fin 14, which has a uniform configuration, to be used as channel region. This enhances the characteristics of the Fin FET formed using the fin 14. Alternatively, however, part of or all insulating layer 15 may be etched to position the punch-through stopper layer 16 closer to the gate electrode 18.

As described in detail, even if a Fin FET is formed using an SOI substrate, the occurrence of a punch-through can be suppressed. The other advantages of the fifth embodiment are similar to those of the first embodiment. Further, it is a matter of course that the fifth embodiment can be applied to any other embodiment.

Sixth Embodiment

A sixth embodiment is directed to a method for providing a uniform impurity concentration profile in each extension region. In the first embodiment, offset spacers 20A and 20B are formed on the opposite sides of the gate electrode 18, and then ions are implanted into the semiconductor substrate 11 perpendicularly (in the Y direction).

If the extension regions are formed by the method of the first embodiment, they have an impurity concentration profile in which the impurity concentration varies in the Y direction in the fin 14. Namely, the impurity concentration in the extension regions is not uniform.

A method for implanting ions into the sides of the fin perpendicularly to the sides (in the X direction, more specifically, obliquely in the X direction) can be employed as another method for forming the extension regions. This method can make uniform the impurity concentration profile of the extension regions. In this method, however, as the density of Fin FETs is increased, it becomes difficult to acquire an angle at which ions are implanted in the X direction.

A description will now be given of a method for manufacturing a semiconductor device according to the sixth embodiment. In the sixth embodiment, firstly, the same process steps as shown in FIGS. 1 to 24 are performed.

Subsequently, as shown in FIG. 49 (perspective view), spacers (gate sidewall insulating films) 22A and 22B formed of, for example, SiN are provided on the opposite sides of the gate electrode 18 by CVD method and RIE method. The opposite sides of the gate electrode 18 are perpendicular to the side surfaces of the fin 14. At this time, because of the manufacturing method, sidewall insulating films 41A and 41B are also formed on the opposite sides of the fin 14. The spacers 22A and 22B and the sidewall insulating films 41A and 41B have a thickness of, for example, 10 nm.

Figure 51:
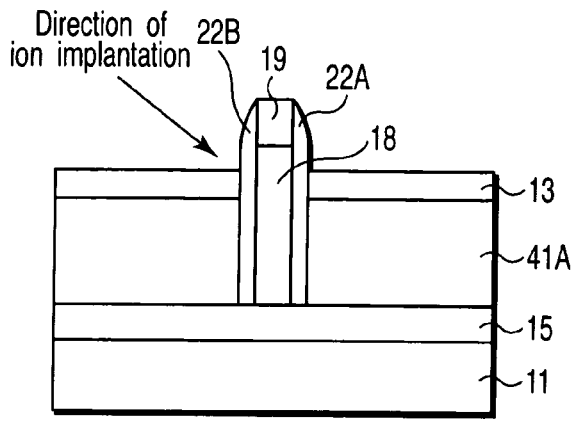
FIG. 51 is a side view when seen from the X direction, illustrating a semiconductor device and useful in explaining a direction of ion implantation.

Thereafter, N⁻-type impurity (e.g. arsenic) ions of a low concentration are implanted into the spacers 22A and 22B and then diffused into the fin 14. As a result, extension regions 42A and 42B are formed in the fin 14. FIG. 50 is a plan view of a semiconductor device, useful in explaining a direction of ion implantation. FIG. 51 is a side view when seen from the X direction, illustrating a semiconductor device and useful in explaining a direction of ion implantation.

In the sixth embodiment, ion implantation is performed in the direction as shown in FIGS. 50 and 51. Further, ion implantation is performed with an accelerating voltage of about 5 keV. The accelerating voltage of 5 keV is set so that the peak concentration position of the implanted impurity is positioned in the spacers 22A and 22B. After that, annealing is performed for recovering crystal defects and electrically activating the implanted ions.

As a result, the impurity ions are uniformly implanted in the spacers 22A and 22B. Accordingly, the implanted ions are uniformly diffused into the fin 14, thereby forming extension regions 42A and 42B of a uniform impurity concentration profile.

Figure 52:
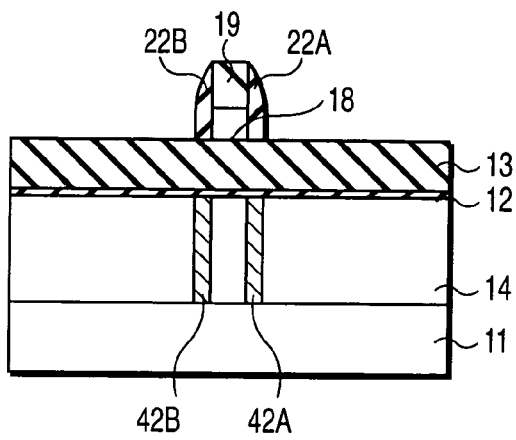
FIG. 52 is a sectional view taken along line A-A' of FIG. 2 and showing extension regions 42A and 42B.

FIG. 52 is a sectional view taken along line A-A' of FIG. 2 and showing the extension regions 42A and 42B. As shown in FIG. 52, the extension regions 42A and 42B are formed in the fin 14 at positions corresponding to the spacers 22A and 22B, respectively.

Thereafter, the mask layer 13 and insulating layer 12 are etched by RIE method to the same level as the surface of the fin 14, using the spacers 22A and 22B as masks. Then, N⁺-type impurity (e.g. arsenic) ions of a high concentration are implanted into the fin 14 using the spacers 22A and 22B as masks, thereby forming a source region 23A and drain region 23B in the fin 14.

As described above in detail, in the manufacturing method of the sixth embodiment, extension regions 42A and 42B of a uniform impurity concentration profile can be formed in the fin 14. More specifically, extension regions 42A and 42B can be formed, which have a uniform impurity concentration profile in the Y direction, and have an optimal impurity concentration profile for the extension regions in the Z direction.

Further, the sixth embodiment does not need, unlike the first embodiment, offset spacers that are used to form the extension regions 21A and 21B. Namely, it is sufficient if opposite gate sidewall insulating films are formed at one time, which reduces the number of process steps required.

In addition, the semiconductor substrate used in the sixth embodiment is not limited to a bulk substrate, but may be an SOI substrate as in the fifth embodiment.

Seventh Embodiment

In each of the above-described embodiments, the invention is applied to a Fin FET having a double-gate structure. However, the invention is not limited to this, but may be applied to a Fin FET having another gate structure. A description will be given of a Fin FET having another gate structure.

Figure 53:
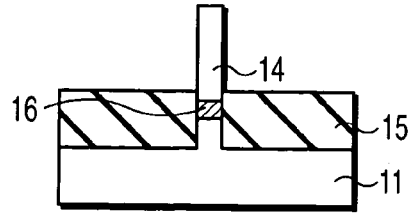
FIG. 53 is a sectional view taken along line B-B' of FIG. 2 and showing a step included in a method for manufacturing a Fin FET of a try gate structure.

Referring first to FIGS. 53 to 57, a description be given of a Fin FET having a tri-gate structure. FIGS. 53 to 56 are sectional views taken along line B-B' of FIG. 2. In the seventh embodiment, firstly, the same process steps as shown in FIGS. 1 to 11 (until the punch-through stopper layer 16 is formed) are performed. Subsequently, as shown in FIG. 53, the mask layer 13 and insulating layer 12 are all etched by, for example, RIE method.

Figure 54:
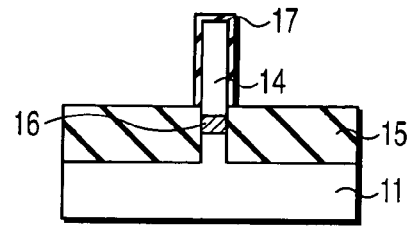
FIG. 54 is a sectional view taken along line B-B' of FIG. 2 and showing a step included in the method and following the step of FIG. 53.
Figure 55:
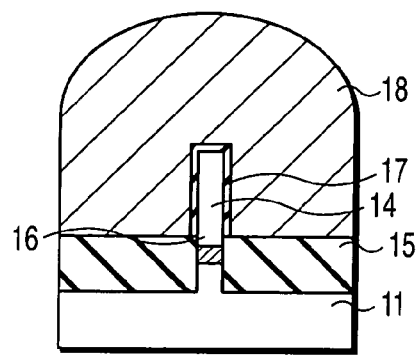
FIG. 55 is a sectional view taken along line B-B' of FIG. 2 and showing a step included in the method and following the step of FIG. 54.

Subsequently, as shown in FIG. 54, the fin 14 is thermally oxidized, thereby forming a gate insulating film 17 on the upper surface of the fin 14 and on opposite side surfaces of the fin 14 which upwardly extend from the upper surface of the insulating layer 15. Then, as shown in FIG. 55, polysilicon 18 is deposited on the insulating layer 15, surrounding the fin 14.

Figure 56:
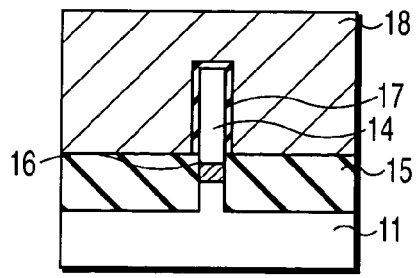
FIG. 56 is a sectional view taken along line B-B' of FIG. 2 and showing a step included in the method and following the step of FIG. 55.
Figure 57:
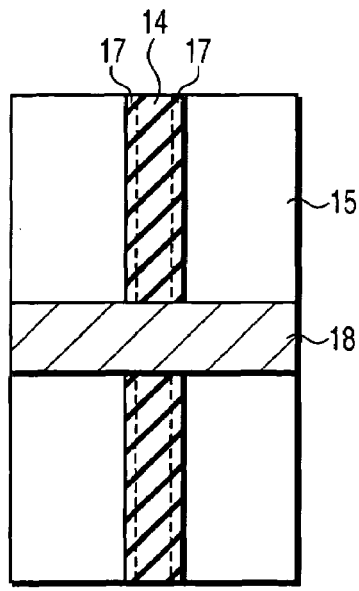
FIG. 57 is a plan view showing a step included in the method and following the step of FIG. 56.

The surface of the polysilicon layer 18 is flattened by CMP method as shown in FIG. 56. A hard mask layer 19 is formed on the polysilicon layer 18, and the polysilicon layer 18 is etched to a desired plan configuration by RIE method using the hard mask layer 19 as a mask. As a result, the gate electrode 18 shown in FIG. 57 (plan view) is formed. The process steps performed later are the same as those of the first embodiment.

Thus, a Fin FET of a tri-gate structure is formed. The tri-gate Fin FET can be controlled by three gate electrodes provided on the upper surface and opposite side surfaces of the fin 14.

Figure 58:
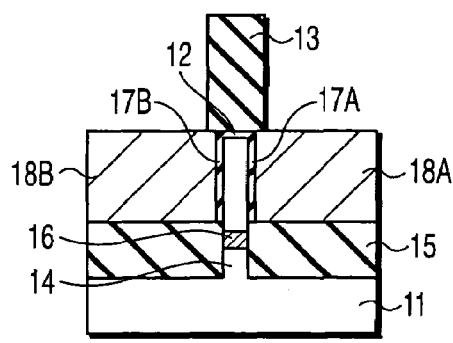
FIG. 58 is a sectional view taken along line B-B' of FIG. 2 and showing a step included in a method for manufacturing a Fin FET of a four-terminal double-gate structure.

A Fin FET of a four-terminal double-gate structure will be described. The process steps shown in FIGS. 1 to 17 are firstly performed as in the first embodiment. Subsequently, as shown in FIG. 58 (a sectional view taken along line B-B' of FIG. 2), the polysilicon layer 18 is etched to the same level as the top of the fin 14 by, for example, RIE method. As a result, the polysilicon layer 18 is divided into electrically disconnected two polysilicon layers 18A and 18B.

Figure 59:
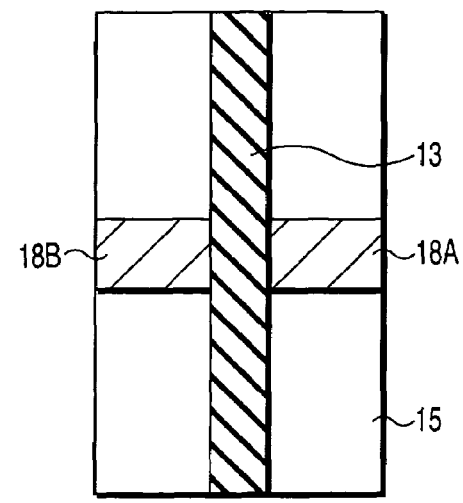
FIG. 59 is a plan view showing a step included in the method and following the step of FIG. 58.

After that, a hard mask layer 19 is formed on the polysilicon layers 18A and 18B, and the polysilicon layers 18A and 18B are etched to a desired plan configuration by RIE method using the hard mask layer 19 as a mask. As a result, the gate electrodes 18A and 18B shown in FIG. 59 (plan view) are formed. The process steps performed later are the same as those of the first embodiment. Thus, a Fin FET of a four-terminal double-gate structure is formed.

Thus, this Fin FET has two gate electrodes 18A and 18B, which are electrically disconnected and hence can be individually controlled. Namely, the Fin FET can be operated, using four terminals connected to the gate electrodes 18A and 18B, source region and drain region.

Figure 60:
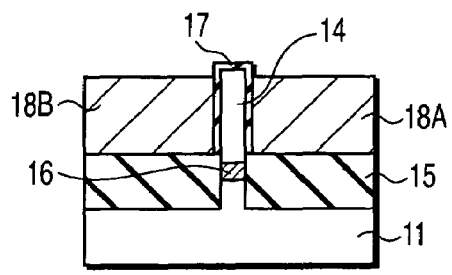
FIG. 60 is a sectional view taken along line B-B' of FIG. 2 and showing a step included in another method for manufacturing a Fin FET of a four-terminal double-gate structure.

A description will now be given of a Fin FET of a four-terminal double-gate structure, which includes no mask layer 13. Firstly, the same process steps as those of the tri-gate Fin FET shown in FIGS. 1 to 11 and 53 to 56 are performed. After that, as shown in FIG. 60 (a sectional view taken along line B-B' of FIG. 2), the polysilicon layer 18 is etched by RIE method to a level between the top of the fin 14 and the surface of the STI 15, with the result that it is divided into two electrically disconnected polysilicon layers 18A and 18B.

Figure 61:
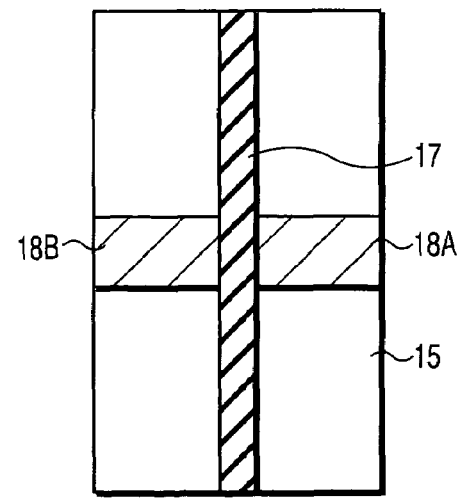
FIG. 61 is a plan view showing a step included in the method and following the step of FIG. 60.

Thereafter, a hard mask layer 19 is formed on the polysilicon layers 18A and 18B, and the polysilicon layers 18A and 18B are etched to a desired plan configuration by RIE method using the hard mask layer 19 as a mask. As a result, the gate electrodes 18A and 18B shown in FIG. 61 (plan view) are formed. The process steps performed later are the same as those of the first embodiment. Thus, a Fin FET of a four-terminal double-gate structure, including no mask layer 13, is formed.

As described above in detail, also when the first to sixth embodiment are applied to each Fin FET according to the seventh embodiment, the advantages of the invention can be acquired.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a mask layer on a first-conductivity-type semiconductor substrate;
    etching the semiconductor substrate using the mask layer as a mask, thereby forming a projecting semiconductor layer;
    forming a first insulating layer on the semiconductor substrate to cover a lower portion of the projecting semiconductor layer;
    doping a first-conductivity-type impurity into the first insulating layer, with a mask member covering an entire top surface of the projecting semiconductor layer;
    moving the impurity doped into the first insulating layer into the lower portion of the projecting semiconductor layer, thereby forming a high-impurity-concentration layer in the lower portion of the projecting semiconductor layer;
    forming gate insulating films on side surfaces of the projecting semiconductor layer which upwardly extend from an upper surface of the first insulating layer; and
    forming a gate electrode on the gate insulating films and on the first insulating film.

2. The method according to claim 1, wherein the high-impurity-concentration layer has a peak impurity concentration in the projecting semiconductor layer between an upper surface of the semiconductor substrate and the upper surface of the first insulating layer.

3. The method according to claim 1, wherein the first-conductivity-type impurity is doped perpendicularly to the semiconductor substrate.

4. The method according to claim 1, further comprising thermally treating the first insulating layer and the projecting semiconductor layer to diffuse the first-conductivity-type impurity, after forming the high-impurity-concentration layer.

5. The method according to claim 1, wherein the high-impurity-concentration layer is formed below a channel region formed in the projecting semiconductor layer.

6. The method according to claim 1, further comprising:
    etching the first insulating layer to a predetermined depth to make the high-impurity-concentration layer closer to the gate electrode, after forming the high-impurity-concentration layer.

7. The method according to claim 1, wherein the high-impurity-concentration layer has a higher impurity concentration than a channel region formed in the projecting semiconductor layer.

8. The method according to claim 1, wherein the high-impurity-concentration layer serves as a punch-through stopper layer for suppressing occurrence of a punch-through.

9. The method according to claim 1, wherein the doping the first-conductivity-type impurity includes implanting ions of the first-conductivity-type impurity.

10. The method according to claim 1, wherein the high-impurity-concentration layer has substantially a same peak impurity concentration as the first insulating layer.

11. The method according to claim 1, wherein a level at which the high-impurity-concentration layer has a peak impurity concentration is substantially identical to a level at which the first insulating layer has a peak impurity concentration.

12. The method according to claim 1, wherein the first insulating layer serves as an element isolation region for electrically isolating elements.

13. The method according to claim 1, wherein the mask member is set to a thickness that prevents the impurity from reaching the top surface of the projecting semiconductor layer.

14. The method according to claim 1, wherein the impurity doped in the first insulating layer diffuses by heat treatment.

15. The method according to claim 14, wherein the impurity doped in the first insulating layer moves laterally by the heat treatment.

16. The method according to claim 14, wherein the impurity doped in the first insulating layer is introduced in the projecting semiconductor layer.

17. The method according to claim 1, wherein the impurity doped into the first insulating layer moves into the lower portion of the projecting semiconductor layer by diffusion.

18. The method according to claim 3, wherein the first-conductivity-type impurity is doped perpendicularly to the semiconductor substrate so as not to contact any side surfaces of the projecting semiconductor layer, and wherein the impurity is provided to the lower portion of the projecting semiconductor layer only by way of the impurity moving from the first insulating layer sideways into the lower portion of the projecting semiconductor layer.

19. The method according to claim 1, wherein the impurity is doped into the first insulating layer by using an accelerating voltage of a predetermined value so as to have a peak concentration of the impurity positioned within the first insulating layer and not in layers positioned below the first insulating layer.

20. The method according to claim 19, wherein the predetermined value corresponds to about 5 keV.

21. The method according to claim 1, wherein the impurity is doped into the first insulating layer by using an accelerating voltage of a predetermined value so as to have a peak concentration of the impurity positioned at a quarter of a depth of the first insulating layer from a top surface thereof.

22. The method according to claim 21, wherein the predetermined value corresponds to about 5 keV.

* * * * *